(12) United States Patent
Masuda et al.

(10) Patent No.: US 7,504,887 B2
(45) Date of Patent: Mar. 17, 2009

(54) HIGH-FREQUENCY POWER AMPLIFIER AND COMMUNICATION DEVICE

(75) Inventors: Takuya Masuda, Shizuoka (JP); Motoyoshi Iwata, Osaka (JP); Shinichiro Ishihara, Osaka (JP)

(73) Assignee: Panasonic Corporation, Osaka (JP)

( * ) Notice: Subject to any disclaimer, the term of this patent is extended or adjusted under 35 U.S.C. 154(b) by 97 days.

(21) Appl. No.: 11/783,463

(22) Filed: Apr. 10, 2007

(65) Prior Publication Data

US 2007/0236293 A1    Oct. 11, 2007

(30) Foreign Application Priority Data

Apr. 10, 2006  (JP)  ............... P. 2006-107651
Feb. 28, 2007  (JP)  ............... P. 2007-049661

(51) Int. Cl.
*H03F 3/04*    (2006.01)
(52) U.S. Cl. ................................................. 330/289
(58) Field of Classification Search ................ 330/133, 330/285, 289
See application file for complete search history.

(56) References Cited

U.S. PATENT DOCUMENTS 6,492,869 B1*   12/2002   Kuriyama ................. 330/133
7,358,817 B2*    4/2008   Kao et al. ................. 330/296
2004/0251967 A1* 12/2004  Moriwaki et al. ......... 330/296

FOREIGN PATENT DOCUMENTS

JP    2002-009558 A    1/2002
JP       3377675        2/2003

* cited by examiner

*Primary Examiner*—Steven J Mottola
(74) *Attorney, Agent, or Firm*—McDermott Will & Emery LLP

(57) ABSTRACT

To provide a high-frequency power amplifier capable of improving the linearity and efficiency of a high-frequency power amplifier by stabilizing, at high frequencies, the bias voltage of a bias circuit featuring the temperature compensating effect of a high-frequency amplifying transistor, a capacitor 61 is connected between the base of a bias supply transistor 41 and a reference potential. It is thus possible to possible to suppress variations in the base voltage of the bias supply transistor 41 in particular when the high-frequency power amplifier is at high output and improve the linearity of the high-frequency power amplifier.

7 Claims, 35 Drawing Sheets

HIGH-FREQUENCY POWER AMPLIFIER AND COMMUNICATION DEVICE

BACKGROUND OF THE INVENTION

1. Field of the Invention

The present invention relates to a high-frequency power amplifier and in particular to a high-frequency power amplifier used in a wireless LAN terminal and a mobile portable terminal.

2. Description of the Related Art

As a device excellent in high-frequency characteristics, a hetero-junction bipolar transistor (hereinafter referred to as the HBT) is used in a high-frequency power amplifier. Recently, to miniaturize wireless LAN terminals or mobile portable terminals, high-frequency power amplifier comprising HBTs is integrated, for example, into a MMIC (Microwave Monolithic IC) comprising high-frequency amplification transistors and bias circuits. An example that aims to enhance the characteristics of a high-frequency power amplifier including a bias circuit is a high-frequency power amplifier described in Patent Reference 1. FIG. 33 shows the structure of the high-frequency power amplifier.

In the circuit shown in FIG. 33, a bias supply transistor 41 is connected to the base of a high-frequency power amplifying transistor 31. To the base of the bias supply transistor 41 is connected a bias circuit for supplying a bias voltage composed of resistors 51, 52. Further, between the connection point of the bias supply transistor 41 and the bias circuit and the reference potential is connected a capacitor 61. Between an input terminal 01 of a high-frequency power amplifier and the high-frequency power amplifying transistor 31 as well as between an output terminal 02 and the high-frequency power amplifying transistor 31 are respectively inserted matching circuits 11, 12.

In this circuit configuration, the power amplitude of the base of the high-frequency power amplifying transistor 31 is greater in high-output operation, so that the bias supply transistor 41 is unstable at high frequencies. That is, the high-frequency signal of a high-frequency amplifying transistor influences the base potential of the bias supply transistor 41. As a result, the voltage across the base and emitter of the bias supply transistor 41 drops and the current supply to the high-frequency power amplifying transistor 31 is likely to decrease.

Accordingly, as the output amplitude of the high-frequency power amplifying transistor 31 tends to increase, the operating point drops at the same time and high output is likely to result in gain compression. With the circuit shown in FIG. 33, the capacitor 61 instantaneously supplies a current to the base of the bias supply transistor 41 by way of charging or discharging a current to reduce a high-frequency-based drop in the voltage applied to the base of the high-frequency power amplifying transistor 31, thereby maintaining the operating point and having an efficient effect on the gain compression.

However, with the high-frequency power amplifying transistor 31 or bias supply transistor 41, a temperature rise due to heat in operation causes variations in the base-transmitter voltage for optimum operation. The bias circuit designed based on simple resistive potential division as shown in FIG. 33 cannot compensate for such variations and characteristics of the transistor substantially vary with variations in temperature.

An example of a bias circuit featuring temperature compensation is a high-frequency power amplifier described in Patent Reference 2, whose structure is shown in FIG. 34. Referring to FIG. 34, the high-frequency power amplifier comprises a high-frequency power amplifying transistor 31, a first temperature compensating transistor 42 for supplying to the high-frequency power amplifying transistor 31 a current corresponding to a voltage applied to a bias voltage supply terminal, and a second temperature compensating transistor 43 for correcting a bias current supplied from the bias supply transistor 41 to the high-frequency power amplifying transistor 31 in accordance with a current flowing through the first temperature compensating transistor. Resistors 51, 52, 54 are for regulating a bias current. A numeral 01 represents the input terminal of a high-frequency power amplifier, 02 the output terminal of an high-frequency power amplifier, 21 a power source terminal, and 22 a control input terminal to which a control signal inputted from outside.

In this circuit configuration, a bias circuit is connected that is composed of the temperature compensating transistors 42 and 43 as well as the resistors 52, 54 for bias regulation. This suppresses variations in the bias current of am amplifier caused by variations in the input voltage.

Patent Reference 1: Japanese Patent No. 3,377,675, Specification (FIG. 4 on Page 6)

Patent Reference 2: JP-A-2002-9558

The voltage supplied to a power source is typically a voltage stabilized by a regulator, so that the variation width of a voltage is relatively small. For example, in case a voltage of 2.8V is supplied and the voltage variation of the regulator is 5 percent, the resulting voltage width is approximately 0.3 volts from 2.66V to 2.94V.

However, in case a stabilized voltage is not given by the regulator for some reason or in case a regulated voltage is not supplied into the device, power is directly supplied from a battery as a power source. This results in a greater variation width of voltage. In the related art circuit shown in FIG. 33, stability against the variation of a power voltage is not provided so that there arises a conspicuous problem of degradation of linearity attributable to a drop in a current in the high-output operation.

In the related art circuit show in FIG. 34, leakage of a high-frequency signal from the high-frequency power amplifying transistor 31 to the bias supply transistor 41 in the high-output operation causes the base potential of the bias supply transistor to vary at high frequencies, which causes a problem of degradation of linearity.

To be more precise, in case a high-frequency power amplifying transistor includes multiple stages, a bias supply transistor similar to the bias supply transistor 41 is installed in multiple stages based on the bias voltage determined by the temperature compensating transistor 42 and 43, as shown in FIG. 35.

In FIG. 35, bias supply transistors 41, 44, 47 are installed in correspondence to the high-frequency power amplifying transistors 31, 32, 33 respectively. All the bias supply transistors use the bias voltage of a bias circuit as a reference.

With this configuration, in case the base potential of the temperature compensating transistor 42 that determines the reference voltage of all circuit operations, that is, the bias voltage varies at high frequencies, all the bias supply transistors and all the high-frequency power amplifying transistors are influenced.

SUMMARY OF THE INVENTION

The invention has been accomplished in view of the related art circumstances. An object of the invention is to provide a high-frequency power amplifier and a communication device capable of improving the linearity at high output by preventing the base potential of a temperature compensating transistor from varying at high frequencies.

In order to solve the object, the invention provides a high-frequency power amplifier comprising: an amplifying transistor; a bias supply transistor for supplying a bias current corresponding to the voltage applied to a bias voltage supply terminal to the amplifying transistor; a first temperature compensating transistor for feeding a current corresponding to the voltage supplied to the bias voltage supply terminal; and a second temperature compensating transistor for compensating for the temperature characteristic of the base voltage of a bias supply transistor by correcting the bias current supplied to the first temperature compensating transistor. With this configuration, the bias current of the bias supply transistor is controlled so that the collector current of an amplifying transistor will be kept almost constant despite variations in the power voltage.

At high output, a capacitor may be added between the base of a bias supply transistor and a ground as a countermeasure against leakage of a high-frequency signal from a high-frequency power amplifying transistor to a bias supply transistor thereby improving the linearity at high output.

To improve the stability against variations in the power voltage, a resistor is provided between the base of a bias supply transistor and the base of a first temperature compensating transistor. By adding a capacitor between the base of a bias supply transistor and a reference potential in this circuit, the linearity at high output is improved.

In case a resistor is added in this example, a high-frequency signal leaks via the resistor. Also in case a capacitor is added between the base of a second temperature compensating transistor and a reference potential, it is possible to improve the linearity at high output.

By adding a capacitor between the collector of a first temperature compensating transistor and a reference potential in a circuit comprising a first temperature compensating transistor to be connected to the base of a bias supply transistor via a resistor, it is possible to improve the linearity.

Further, serial connection of an inductor and a capacitor, diode connection, or parallel connection of a diode and a capacitor provides the same advantage.

As described above, according to a high-frequency power amplifier and a communication device of the invention, it is possible to stabilize at high frequencies the bias voltage of a bias circuit featuring the temperature compensating effect of a high-frequency power amplifying transistor and in particular to substantially improve the linearity of the high-frequency power amplifier and the communication system at high output.

DESCRIPTION OF THE PREFERRED EMBODIMENTS

Embodiments of the invention will be described referring to drawings.

First Embodiment

Figure 1:
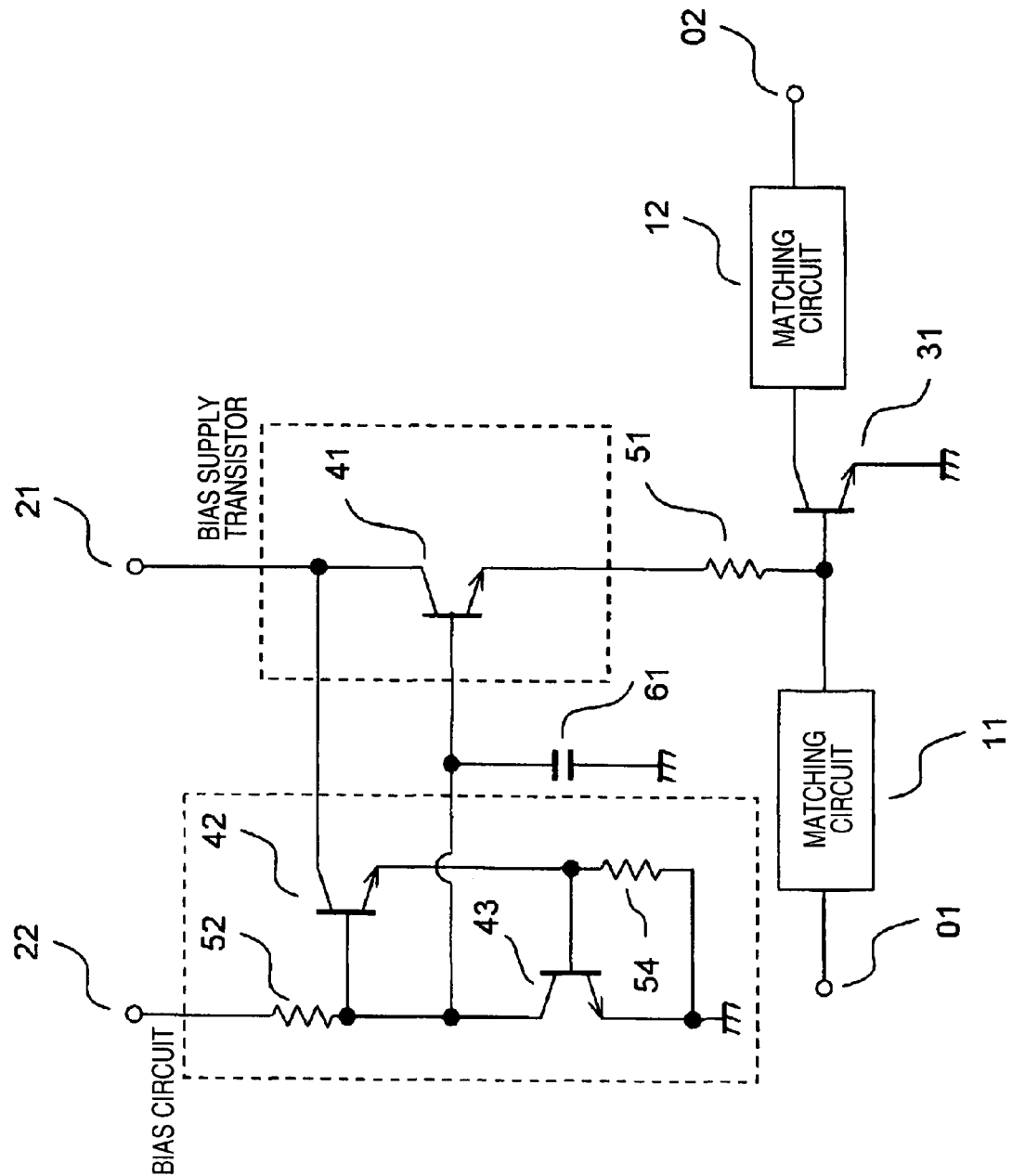
FIG. 1 is a circuit diagram showing the configuration of a high-frequency power amplifier according to the first embodiment of the invention.

FIG. 1 is a circuit diagram of a high-frequency power amplifier according to the first embodiment of the invention. A numeral 01 represents an input terminal of a high-frequency power amplifier and 02 an output terminal. A numeral 31 is a high-frequency power amplifying transistor. Between the high-frequency power amplifying transistor 31 and the input terminal 01 and output terminal 02 of the high-frequency power amplifier are respectively connected a matching circuit 11 on the input side and a matching circuit 12 on the output side.

A numeral 41 represents a bias supply transistor that is connected to the base of the high-frequency power amplifying transistor 31 via a resistor 51. The resistor 51 is used to suppress thermal runaway. A bias circuit is composed of temperature compensating transistors 42, 43 and resistors 52, 54.

A first temperature compensating transistor 42 feeds a current corresponding to the voltage supplied to a bias current supply terminal 22. A second temperature compensating transistor 43 compensates for the temperature characteristic of the base voltage of the bias supply transistor 41 by correcting the bias current supplied from the bias supply transistor 41 to the high-frequency power amplifying transistor 31 in accordance with the current flowing into the first temperature compensating transistor 42.

In this bias circuit, a signal inputted from an input signal terminal 01 is amplified by a high-frequency power amplifying transistor 31 and outputted to a signal terminal 02 via a matching circuit 12. In the high-output operation, the power amplitude of the base of the high-frequency power amplifying transistor 31 increases and the signal leaks into the base of a bias supply transistor 41 via a resistor 51. As a result, the base potential of the bias supply transistor 41 becomes unstable at high frequencies.

A capacitor 61 shown in the first embodiment is designed to stabilize, at high frequencies, the base potential of the bias supply transistor 41 at high output. Even in case the high-frequency-induced variations in the base current in the bias supply transistor 41 permeate a bias circuit thus influencing the base voltage of a temperature compensating transistor 42, it is possible to suppress a high-frequency-induced voltage drop of the resistor 51 and suppress variations in the bias voltage caused by variations in the base voltage of the bias supply transistor 41 by absorbing the variations in a current through charging and discharging of the electric charges of the capacitor 61.

Figure 2:
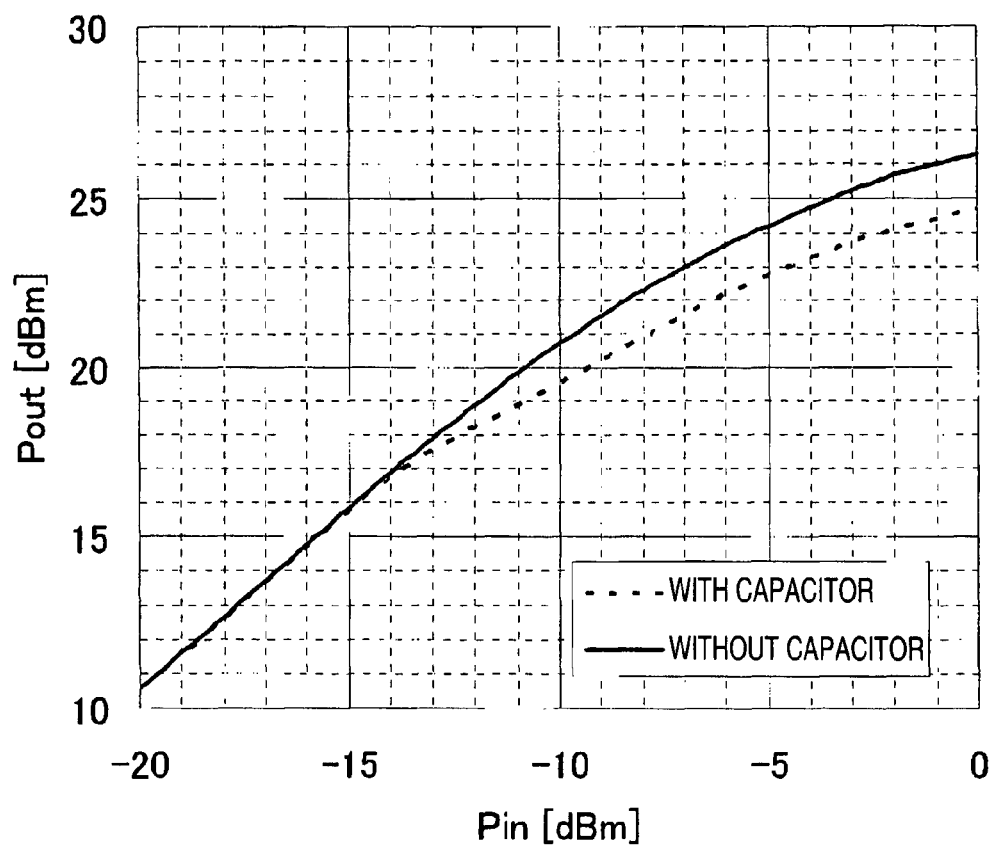
FIG. 2 shows the input/output characteristic dependency of the high-frequency power amplifier according to the first embodiment of the invention.

As a result, it is possible to suppress a drop of the operating point of the high-frequency power amplifying transistor 31 at high output and suppress degradation of linearity due to gain compression. FIG. 2 shows input/output characteristics (shown in solid lines) in the first embodiment. It is understood that the linearity at high output is substantially improved when compared with a related art example (shown in broken lines).

Second Embodiment

Figure 3:
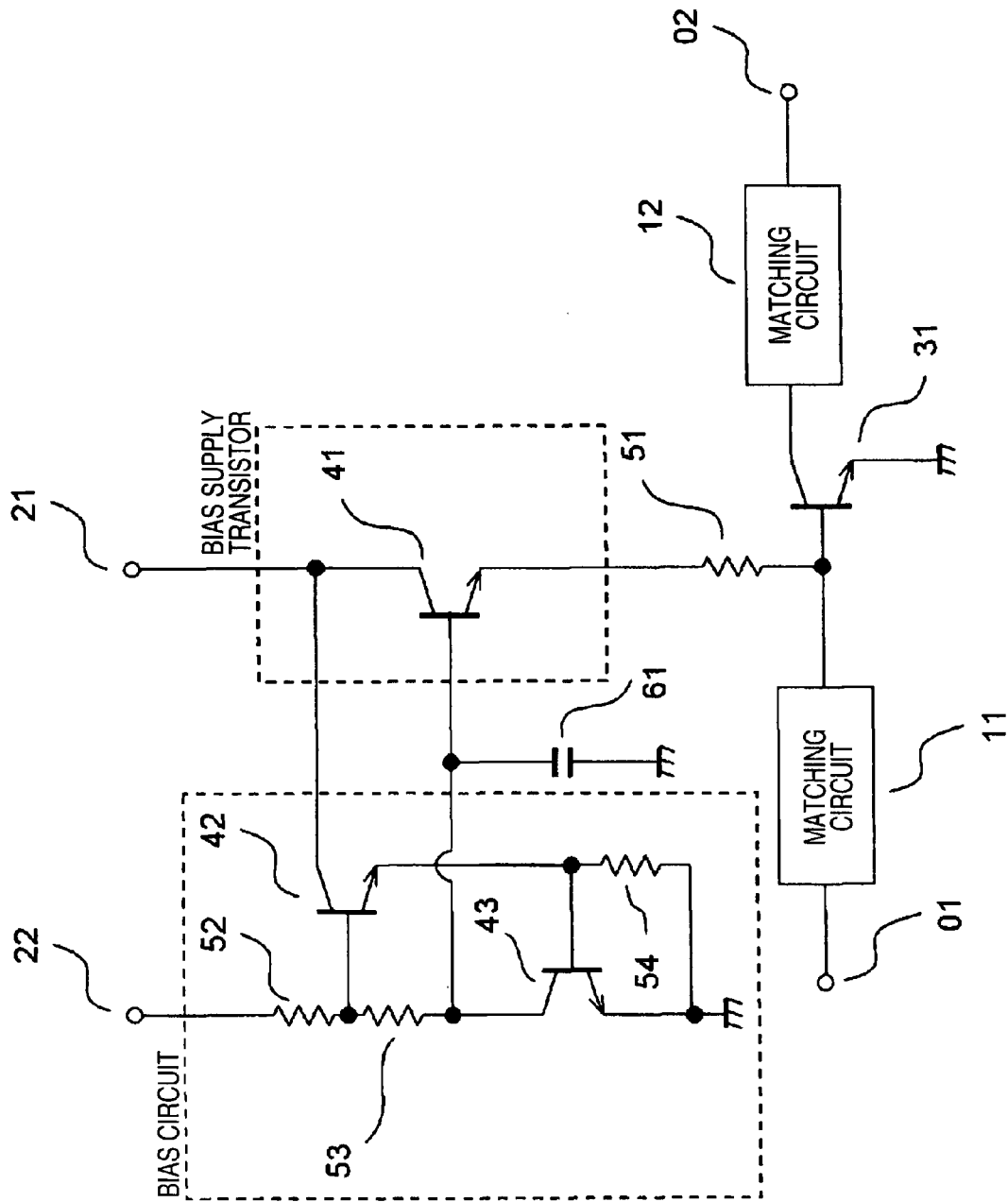
FIG. 3 is a circuit diagram showing the configuration of a high-frequency power amplifier according to the second embodiment of the invention.

FIG. 3 is a circuit diagram of a high-frequency power amplifier according to the second embodiment of the invention. In the high-frequency power amplifier shown in FIG. 3, a resistor 53 is connected between the base of a bias supply transistor 41 and the base of a first temperature compensating transistor in order to suppress variations in the power voltage.

In this bias circuit, a signal inputted from an input signal terminal 01 is amplified by a high-frequency power amplifying transistor 31 and outputted to a signal terminal 02 via a matching circuit 12. In the high-output operation, the power amplitude of the base of the high-frequency power amplifying transistor 31 increases and the signal leaks into the base of a bias supply transistor 41 via a resistor 51. As a result, the base potential of the bias supply transistor 41 becomes unstable at high frequencies.

A capacitor 61 shown in the second embodiment is designed to stabilize, at high frequencies, the base potential of the bias supply transistor 41 at high output. Even in the presence of high-frequency-induced variations in a base current of the bias supply transistor 41, the high-frequency-induced voltage drop of the resistor 51 and variations in the bias voltage caused by variations in the base voltage of the bias supply transistor 41 are suppressed by absorbing the variations in a current through charging and discharging of the electric charges of the capacitor 61. As a result, it is possible to suppress a drop of the operating point of the high-frequency power amplifying transistor 31 at high output and suppress degradation of linearity due to gain compression.

Third Embodiment

Figure 4:
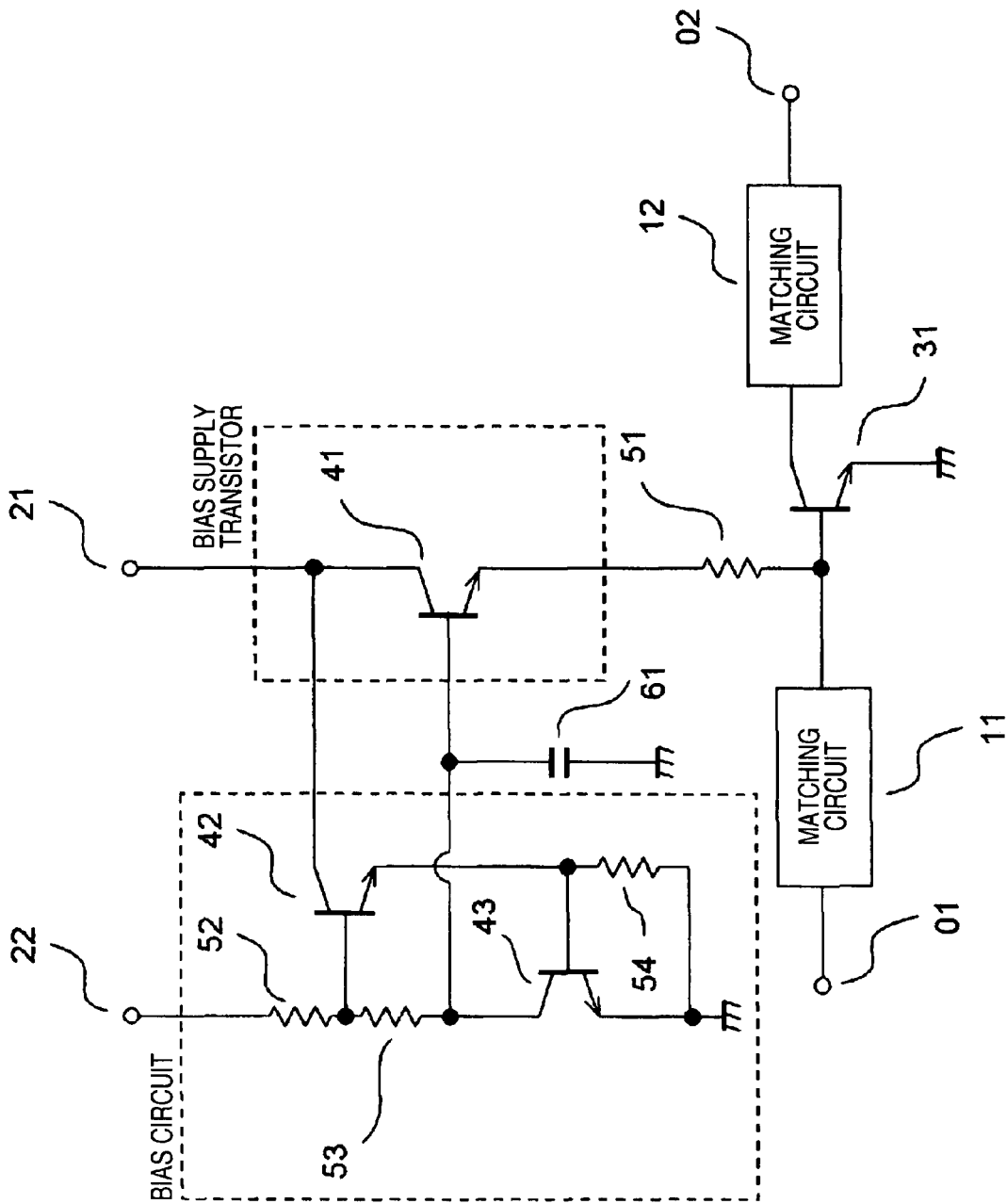
FIG. 4 is a circuit diagram showing the configuration of a high-frequency power amplifier according to the third embodiment of the invention.

FIG. 4 is a circuit diagram of a high-frequency power amplifier according to the third embodiment of the invention. In the high-frequency power amplifier shown in FIG. 4, a resistor 53 is connected between the base of a bias supply transistor 41 and the base of a first temperature compensating transistor in order to suppress variations in the power voltage.

In this bias circuit, a signal inputted from an input signal terminal 01 is amplified by a high-frequency power amplifying transistor 31 and outputted to a signal terminal 02 via a matching circuit 12. In the high-output operation, the power amplitude of the base of the high-frequency power amplifying transistor 31 increases and the signal leaks into the base of a bias supply transistor 41 via a resistor 51. As a result, the base potential of the bias supply transistor 41 becomes unstable at high frequencies.

A capacitor 62 shown in the third embodiment is designed to stabilize, at high frequencies, the base potential of the first temperature compensating transistor 42 at high output. Even in the presence of high-frequency-induced variations in a base current of the bias supply transistor 42, the high-frequency-induced voltage drop of the resistor 51 and variations in the bias voltage caused by variations in the base voltage of the bias supply transistor 41 are suppressed by absorbing the variations in a current through charging and discharging of the electric charges of the capacitor 61. As a result, it is possible to suppress a drop of the operating point of the high-frequency power amplifying transistor 31 at high output and suppress degradation of linearity due to gain compression.

Fourth Embodiment

Figure 5:
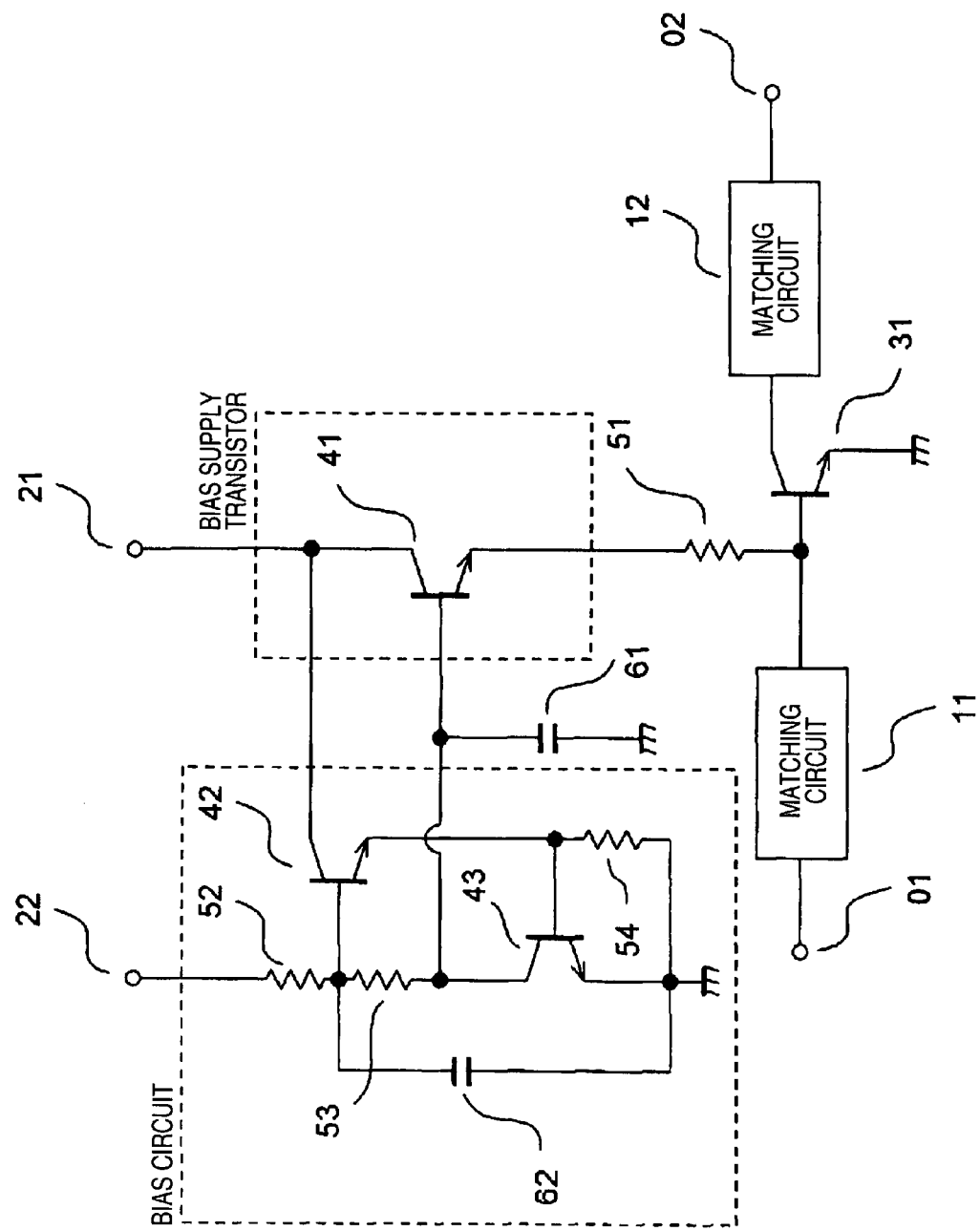
FIG. 5 is a circuit diagram showing the configuration of a high-frequency power amplifier according to the fourth embodiment of the invention.

FIG. 5 is a circuit diagram of a high-frequency power amplifier according to the fourth embodiment of the invention. In the high-frequency power amplifier shown in FIG. 5, a resistor 53 is connected between the base of a bias supply transistor 41 and the base of a first temperature compensating transistor in order to suppress variations in the power voltage.

In this bias circuit, a signal inputted from an input signal terminal 01 is amplified by a high-frequency power amplifying transistor 31 and outputted to a signal terminal 02 via a matching circuit 12. In the high-output operation, the power amplitude of the base of the high-frequency power amplifying transistor 31 increases and the signal leaks into the base of a bias supply transistor 41 via a resistor 51. As a result, the base potential of the bias supply transistor 41 becomes unstable at high frequencies.

Capacitors 61 and 62 shown in the fourth embodiment are designed to stabilize, at high frequencies, the base potential of the bias supply transistor 41 and the base potential of the first temperature compensating transistor 42 at high output. The high-frequency-induced voltage drop of the resistor 51 and variations in the bias voltage caused by variations in the base voltage of the bias supply transistor 41 are suppressed by absorbing the variations in a current through charging and discharging of the electric charges of the capacitors 61 and 62. As a result, it is possible to suppress a drop of the operating point of the high-frequency power amplifying transistor 31 at high output and suppress degradation of linearity due to gain compression.

Fifth Embodiment

Figure 6:
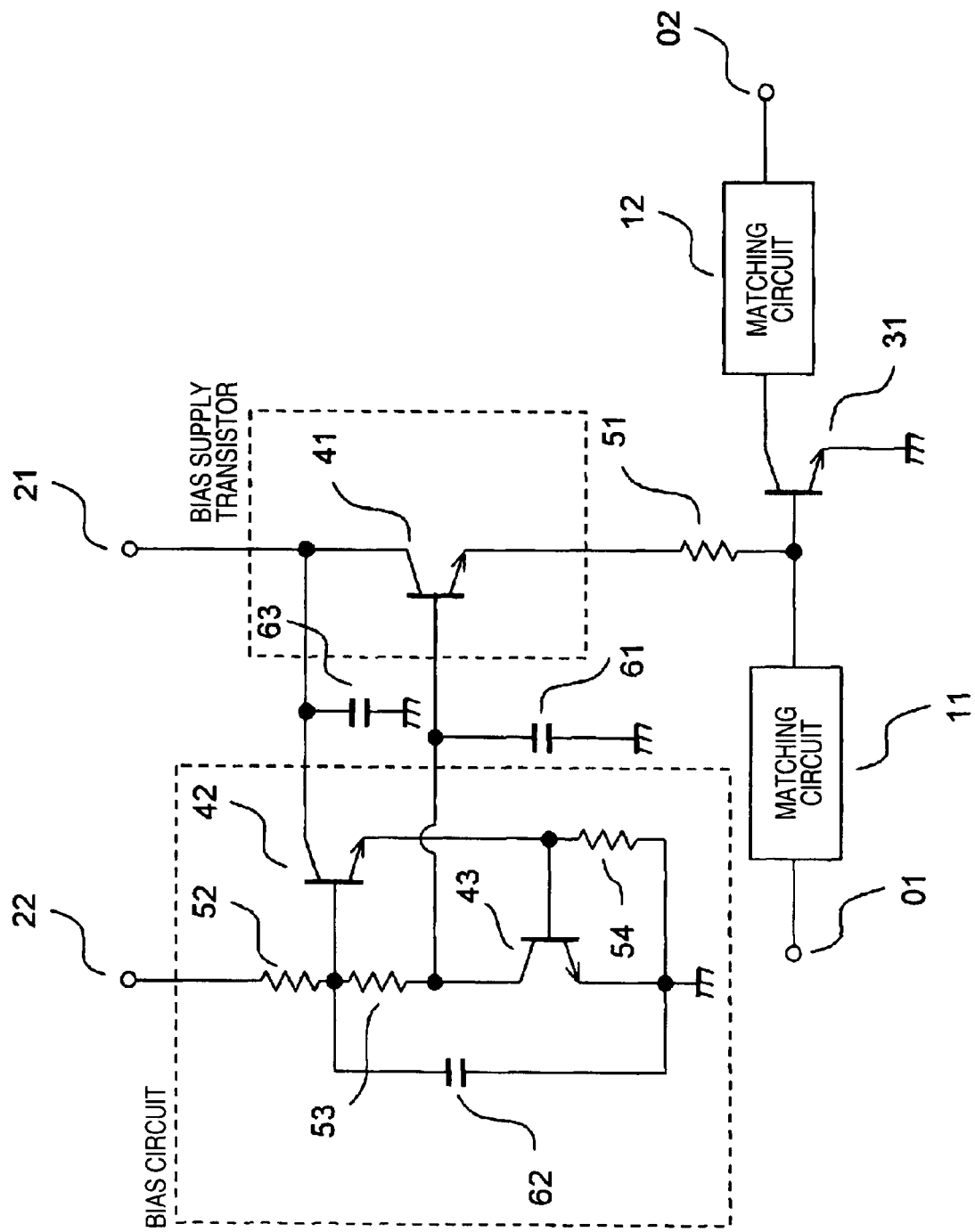
FIG. 6 is a circuit diagram showing the configuration of a high-frequency power amplifier according to the fifth embodiment of the invention.

FIG. 6 is a circuit diagram of a high-frequency power amplifier according to the fifth embodiment of the invention. In the high-frequency power amplifier shown in FIG. 6, a resistor 53 is connected between the base of a bias supply transistor 41 and the base of a first temperature compensating transistor in order to suppress variations in the power voltage.

In this bias circuit, a signal inputted from an input signal terminal 01 is amplified by a high-frequency power amplifying transistor 31 and outputted to a signal terminal 02 via a matching circuit 12. In the high-output operation, the power amplitude of the base of the high-frequency power amplifying transistor 31 increases and the signal leaks into the base of a bias supply transistor 41 via a resistor 51. As a result, the base potential of the bias supply transistor 41 becomes unstable at high frequencies.

Capacitors 61 and 62 shown in the fifth embodiment are designed to stabilize, at high frequencies, the base potential of the bias supply transistor 41 and the base potential of the first temperature compensating transistor 42 at high output. A capacitor 63 is designed to stabilize, at high frequencies, the collector potential of the first temperature compensating transistor 42 and the collector potential of the bias supply transistor 41.

The high-frequency-induced voltage drop of the resistor 51 and variations in the bias voltage caused by variations in the base voltage of the bias supply transistor 41 are suppressed by absorbing the variations in a current through charging and discharging of the electric charges of the capacitors 61, 62 and 63. As a result, it is possible to suppress a drop of the operating point of the high-frequency power amplifying transistor 31 at high output and suppress degradation of linearity due to gain compression. Providing three capacitors further improves the linearity.

Sixth Embodiment

Figure 7:
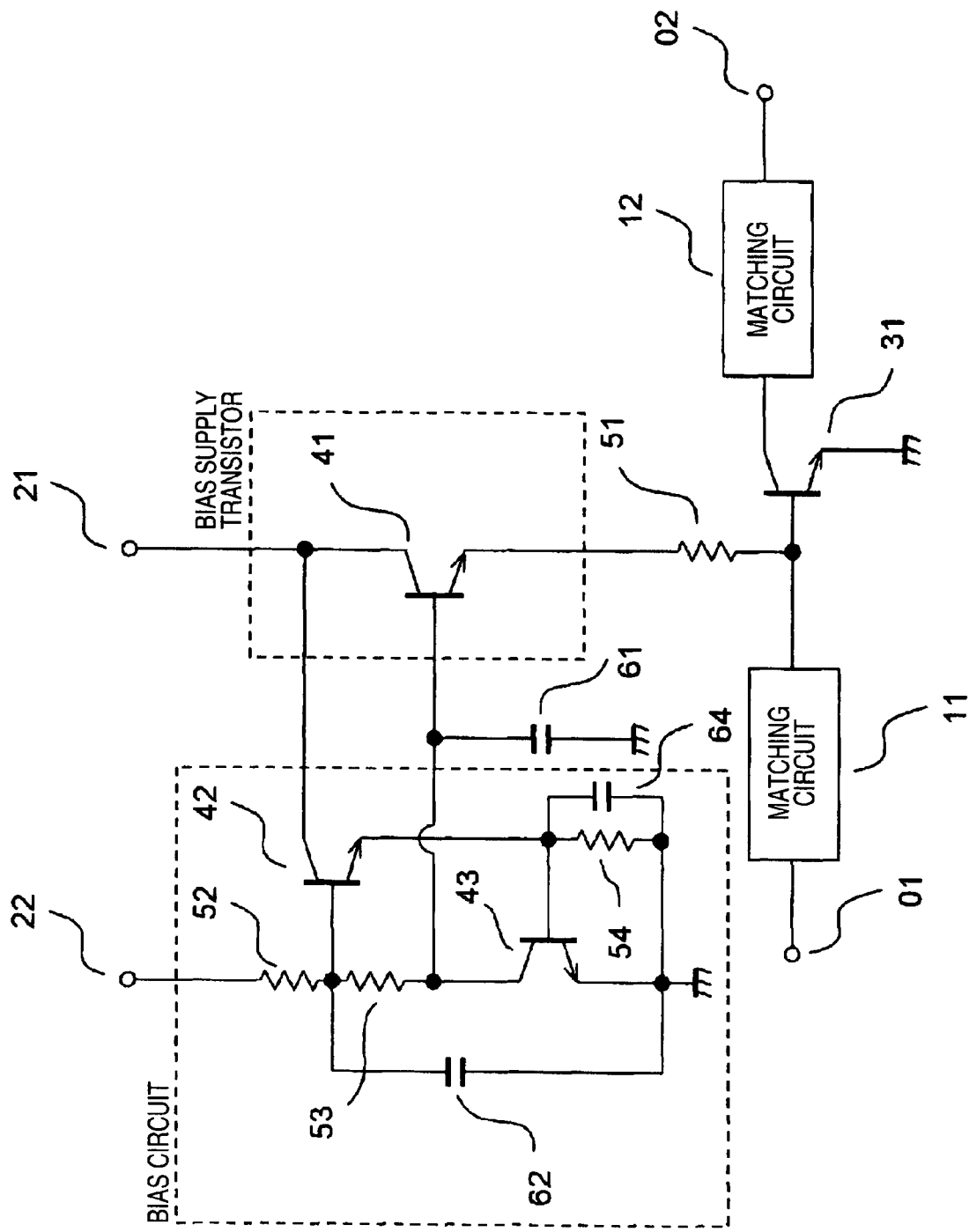
FIG. 7 is a circuit diagram showing the configuration of a high-frequency power amplifier according to the sixth embodiment of the invention.

FIG. 7 is a circuit diagram of a high-frequency power amplifier according to the sixth embodiment of the invention. In the high-frequency power amplifier shown in FIG. 7, a resistor 53 is connected between the base of a bias supply transistor 41 and the base of a first temperature compensating transistor in order to suppress variations in the power voltage.

In this bias circuit, a signal inputted from an input signal terminal 01 is amplified by a high-frequency power amplifying transistor 31 and outputted to a signal terminal 02 via a matching circuit 12. In the high-output operation, the power amplitude of the base of the high-frequency power amplifying transistor 31 increases and the signal leaks into the base of a bias supply transistor 41 via a resistor 51. As a result, the base potential of the bias supply transistor 41 becomes unstable at high frequencies.

Capacitors 61 and 62 shown in the fifth embodiment are designed to stabilize, at high frequencies, the base potential of the bias supply transistor 41 and the base potential of the first temperature compensating transistor 42 at high output. A capacitor 64 is designed to stabilize, at high frequencies, the base potential of the second temperature compensating transistor 43.

The high-frequency-induced voltage drop of the resistor 51 and variations in the bias voltage caused by variations in the base voltage of the bias supply transistor 41 are suppressed by absorbing the variations in a current through charging and discharging of the electric charges of the capacitors 61, 62 and 64. As a result, it is possible to suppress a drop of the operating point of the high-frequency power amplifying transistor 31 at high output and suppress degradation of linearity due to gain compression. Providing three capacitors further improves the linearity.

Seventh Embodiment

Figure 8:
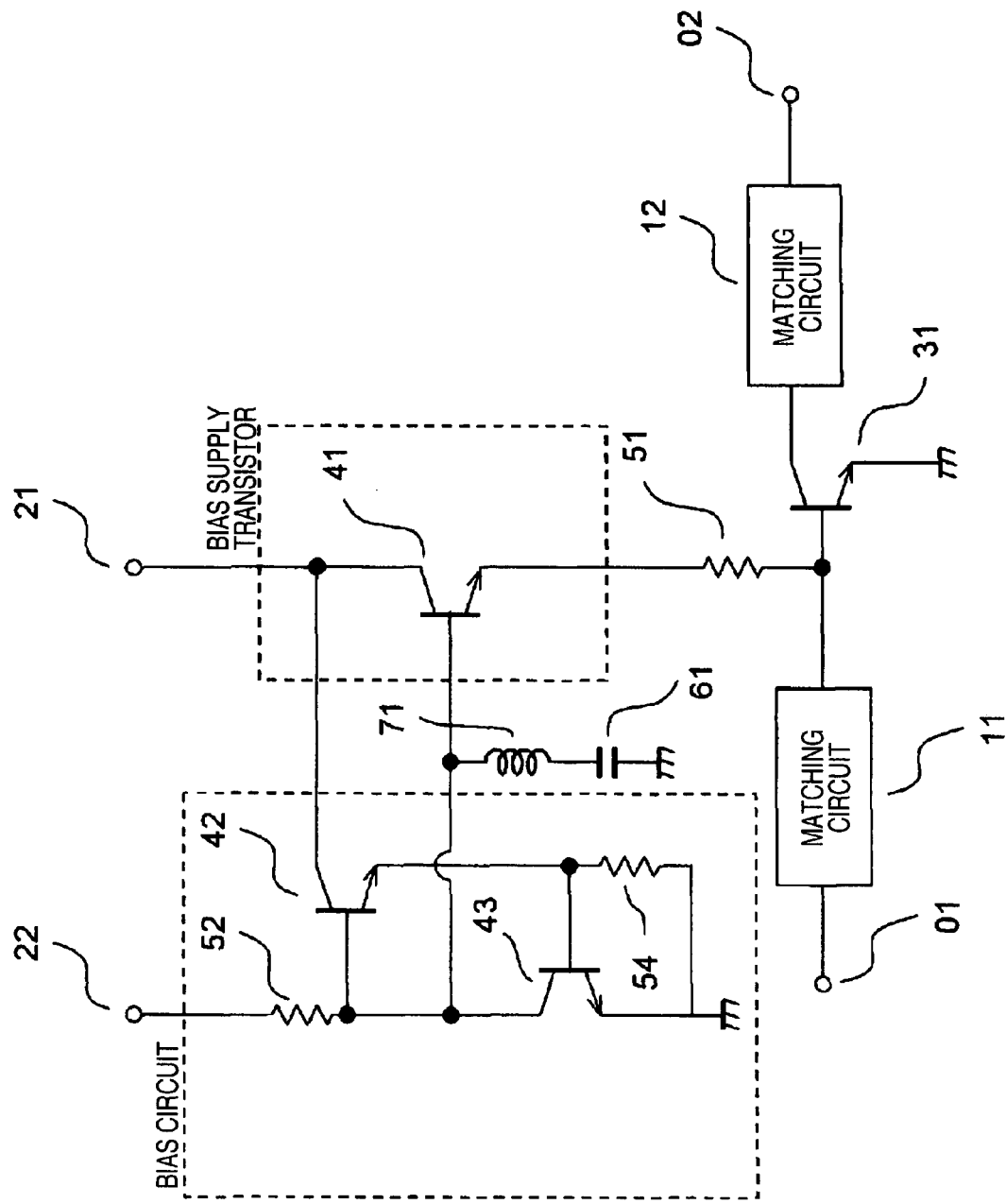
FIG. 8 is a circuit diagram showing the configuration of a high-frequency power amplifier according to the seventh embodiment of the invention.

FIG. 8 is a circuit diagram of a high-frequency power amplifier according to the seventh embodiment of the invention. A numeral 01 represents an input terminal of a high-frequency power amplifier and 02 an output terminal. A numeral 31 is a high-frequency power amplifying transistor. Between the high-frequency power amplifying transistor 31 and the input terminal 01 and output terminal 02 of the high-frequency power amplifier are respectively connected a matching circuit 11 on the input side and a matching circuit 12 on the output side.

A numeral 41 represents a bias supply transistor that is connected to the base of the high-frequency power amplifying transistor 31 via a resistor 51. The resistor 51 is used to suppress thermal runaway. A bias circuit is composed of temperature compensating transistors 42, 43 and resistors 52, 54.

A first temperature compensating transistor 42 feeds a current corresponding to the voltage supplied to a bias current supply terminal 22. A second temperature compensating transistor 43 compensates for the temperature characteristic of the base voltage of the bias supply transistor 41 by correcting the bias current supplied from the bias supply transistor 41 to the high-frequency power amplifying transistor 31 in accordance with the current flowing into the first temperature compensating transistor 42.

In this bias circuit, a signal inputted from an input signal terminal 01 is amplified by a high-frequency power amplifying transistor 31 and outputted to a signal terminal 02 via a matching circuit 12. In the high-output operation, the power amplitude of the base of the high-frequency power amplifying transistor 31 increases and the signal leaks into the base of a bias supply transistor 41 via a resistor 51. As a result, the base potential of the bias supply transistor 41 becomes unstable at high frequencies.

An inductor 71 and a capacitor 61 shown in the seventh embodiment are designed to stabilize, at high frequencies, the base potential of the bias supply transistor 41 at high output. Even in case the high-frequency-induced variations in the base current in the bias supply DC amplifying transistor 41 permeate a bias circuit thus influencing the base voltage of a temperature compensating transistor 42, it is possible to suppress a high-frequency-induced voltage drop of the resistor 51 and suppress variations in the bias voltage caused by variations in the base voltage of the bias supply transistor 41 by absorbing the variations in a current through series-resonance-based charging and discharging of the electric charges of the inductor 71 and the capacitor 61. As a result, it is possible to suppress a drop of the operating point of the high-frequency power amplifying transistor 31 at high output and suppress degradation of linearity due to gain compression.

Eighth Embodiment

Figure 9:
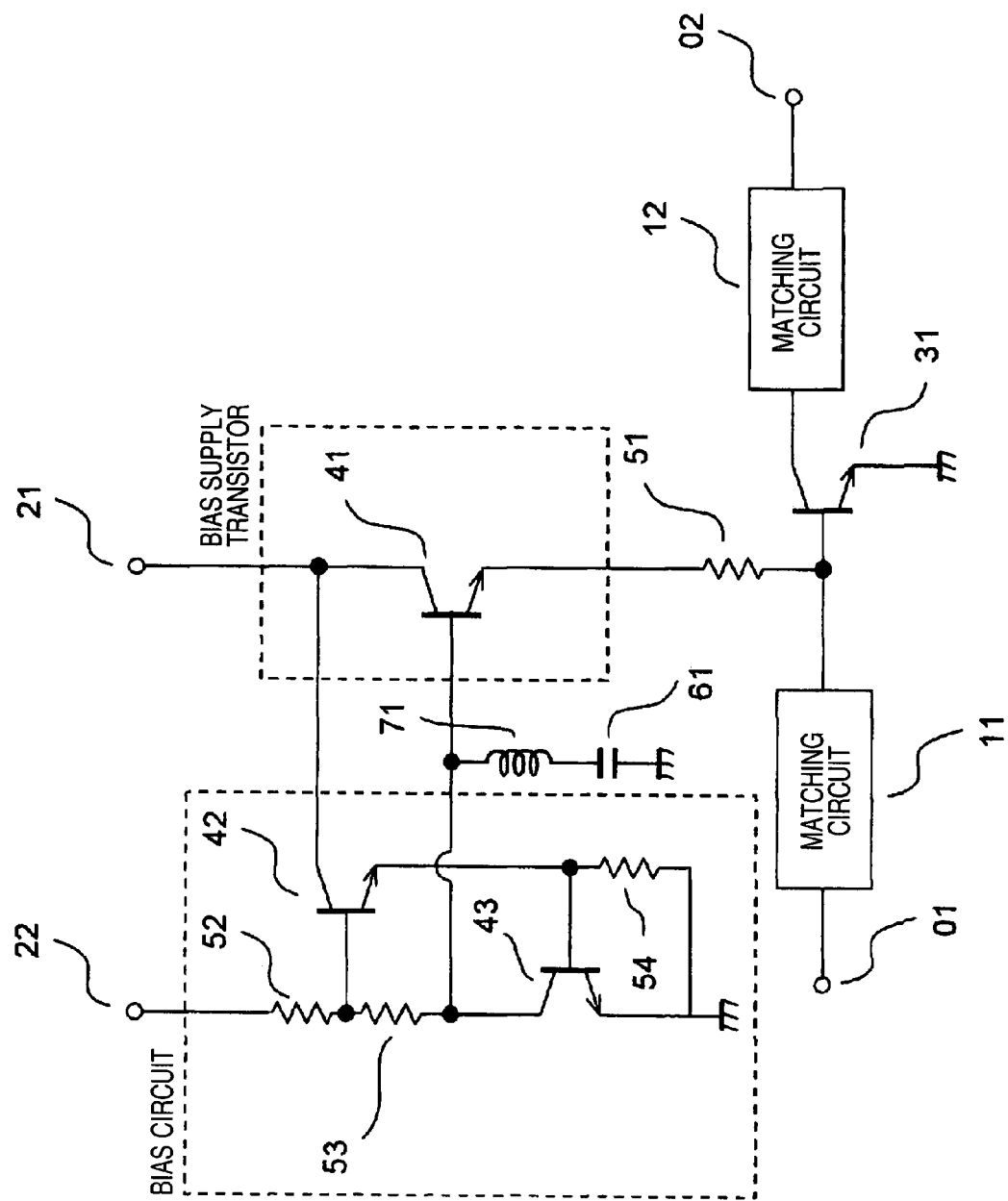
FIG. 9 is a circuit diagram showing the configuration of a high-frequency power amplifier according to the eighth embodiment of the invention.

FIG. 9 is a circuit diagram of a high-frequency power amplifier according to the eighth embodiment of the invention. In the high-frequency power amplifier shown in FIG. 9, a resistor 53 is connected between the base of a bias supply transistor 41 and the base of a first temperature compensating transistor in order to suppress variations in the power voltage.

In this bias circuit, a signal inputted from an input signal terminal 01 is amplified by a high-frequency power amplifying transistor 31 and outputted to a signal terminal 02 via a matching circuit 12. In the high-output operation, the power amplitude of the base of the high-frequency power amplifying transistor 31 increases and the signal leaks into the base of a bias supply transistor 41 via a resistor 51. As a result, the base potential of the bias supply transistor 41 becomes unstable at high frequencies.

An inductor 71 and a capacitor 61 shown in the eighth embodiment are designed to stabilize, at high frequencies, the base potential of the bias supply transistor 41 at high output. Even in the presence of the high-frequency-induced variations in the base current in the bias supply transistor 41, it is possible to suppress a high-frequency-induced voltage drop of the resistor 51 and suppress variations in the bias voltage caused by variations in the base voltage of the bias supply transistor 41 by absorbing the variations in a current through series-resonance-based charging and discharging of the electric charges of the inductor 71 and the capacitor 61. As a result, it is possible to suppress a drop of the operating point of the high-frequency power amplifying transistor 31 at high output and suppress degradation of linearity due to gain compression.

Ninth Embodiment

Figure 10:
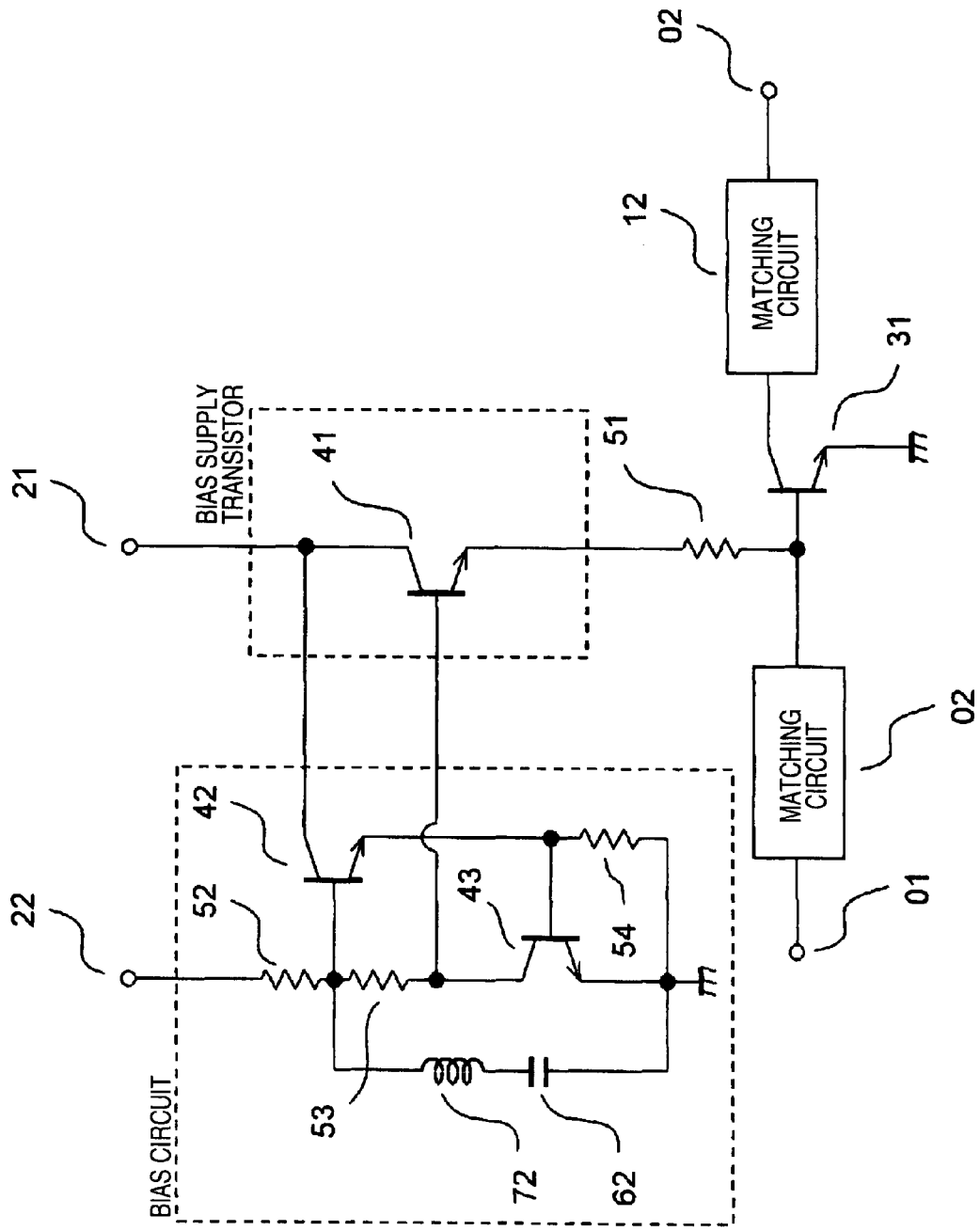
FIG. 10 is a circuit diagram showing the configuration of a high-frequency power amplifier according to the ninth embodiment of the invention.

FIG. 10 is a circuit diagram of a high-frequency power amplifier according to the ninth embodiment of the invention. In the high-frequency power amplifier shown in FIG. 10, a resistor 53 is connected between the base of a bias supply transistor 41 and the base of a first temperature compensating transistor in order to suppress variations in the power voltage.

In this bias circuit, a signal inputted from an input signal terminal 01 is amplified by a high-frequency power amplifying transistor 31 and outputted to a signal terminal 02 via a matching circuit 12. In the high-output operation, the power amplitude of the base of the high-frequency power amplifying transistor 31 increases and the signal leaks into the base of a bias supply transistor 41 via a resistor 51. As a result, the base potential of the bias supply transistor 41 becomes unstable at high frequencies.

An inductor 72 and a capacitor 62 shown in the ninth embodiment are designed to stabilize, at high frequencies, the base potential of a temperature compensating transistor 42 at high output. Even in the presence of the high-frequency-induced variations in the base current in the bias supply transistor 42, it is possible to suppress a high-frequency-induced voltage drop of the resistor 51 and suppress variations in the bias voltage caused by variations in the base voltage of the bias supply transistor 41 by absorbing the variations in a current through series-resonance-based charging and discharging of the electric charges of the inductor 72 and the capacitor 62. As a result, it is possible to suppress a drop of the operating point of the high-frequency power amplifying transistor 31 at high output and suppress degradation of linearity due to gain compression.

Tenth Embodiment

Figure 11:
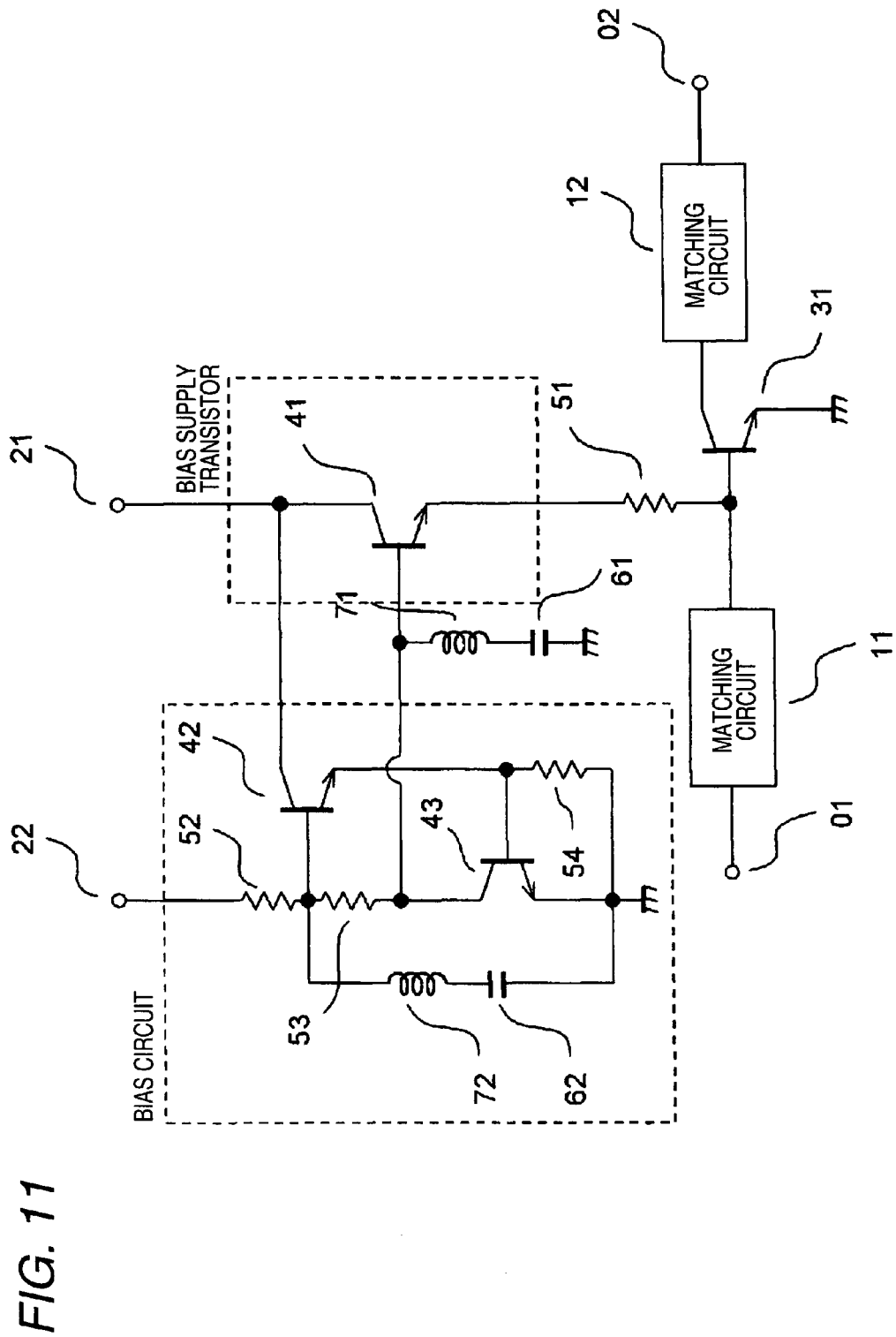
FIG. 11 is a circuit diagram showing the configuration of a high-frequency power amplifier according to the tenth embodiment of the invention.

FIG. 11 is a circuit diagram of a high-frequency power amplifier according to the tenth embodiment of the invention. In the high-frequency power amplifier shown in FIG. 11, a resistor 53 is connected between the base of a bias supply transistor 41 and the base of a first temperature compensating transistor in order to suppress variations in the power voltage.

In this bias circuit, a signal inputted from an input signal terminal 01 is amplified by a high-frequency power amplifying transistor 31 and outputted to a signal terminal 02 via a matching circuit 12. In the high-output operation, the power amplitude of the base of the high-frequency power amplifying transistor 31 increases and the signal leaks into the base of a bias supply transistor 41 via a resistor 51. As a result, the base potential of the bias supply transistor 41 becomes unstable at high frequencies.

Inductors 71 and 72 and capacitors 61 and 62 shown in the tenth embodiment are designed to stabilize, at high frequencies, the base potential of each of the bias supply transistor 41 and a first temperature compensating transistor 42 at high output. It is possible to suppress a high-frequency-induced voltage drop of the resistor 51 and suppress variations in the bias voltage caused by variations in the base voltage of the bias supply transistor 41 by absorbing the variations in a current through series-resonance-based charging and discharging of the electric charges of the inductor 71 and the capacitor 61 as well as the inductor 72 and the capacitor 62. As a result, it is possible to suppress a drop of the operating point of the high-frequency power amplifying transistor 31 at high output and suppress degradation of linearity due to gain compression.

Eleventh Embodiment

Figure 12:
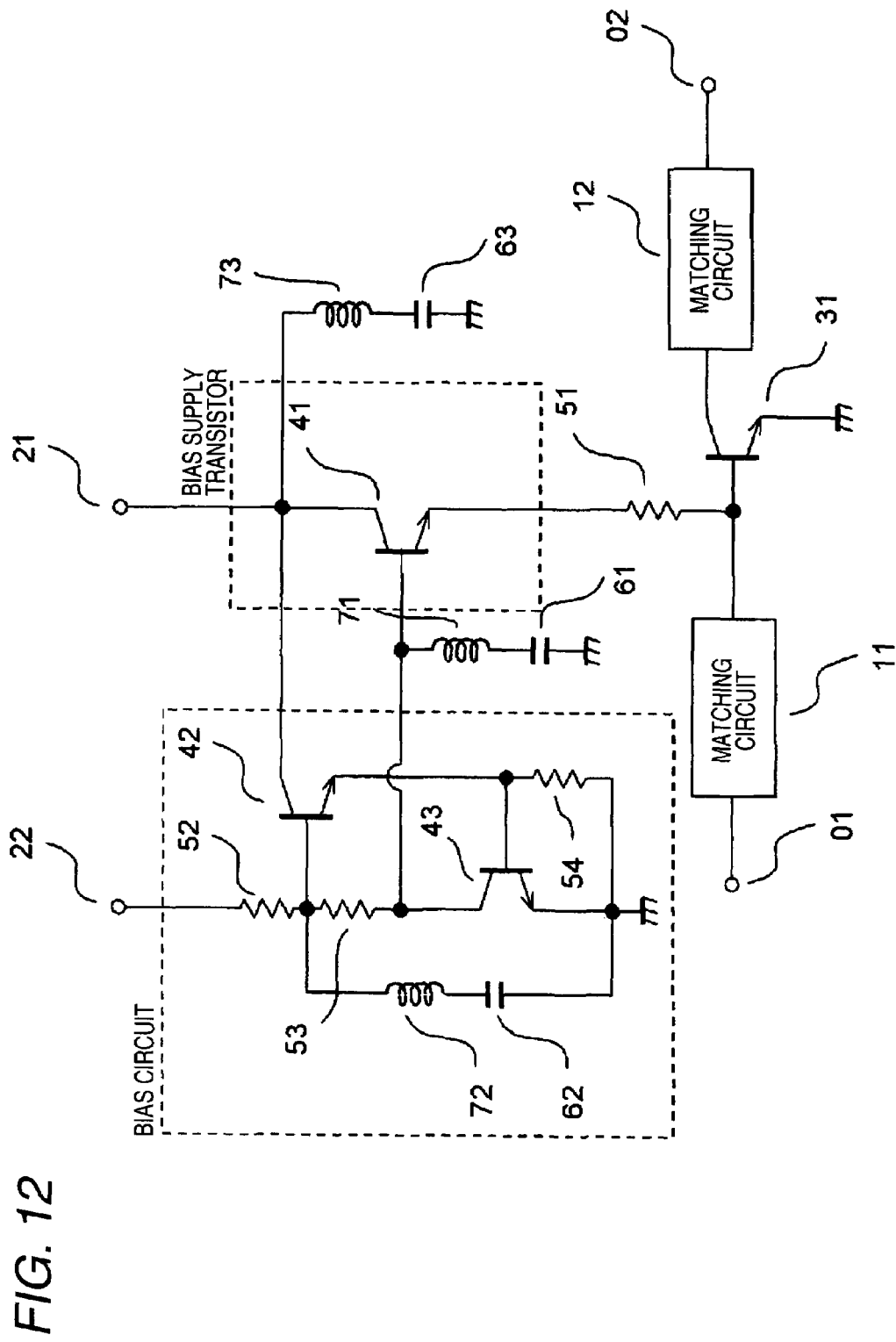
FIG. 12 is a circuit diagram showing the configuration of a high-frequency power amplifier according to the eleventh embodiment of the invention.

FIG. 12 is a circuit diagram of a high-frequency power amplifier according to the eleventh embodiment of the invention. In the high-frequency power amplifier shown in FIG. 12, a resistor 53 is connected between the base of a bias supply transistor 41 and the base of a first temperature compensating transistor in order to suppress variations in the power voltage.

In this bias circuit, a signal inputted from an input signal terminal 01 is amplified by a high-frequency power amplifying transistor 31 and outputted to a signal terminal 02 via a matching circuit 12. In the high-output operation, the power amplitude of the base of the high-frequency power amplifying transistor 31 increases and the signal leaks into the base of a bias supply transistor 41 via a resistor 51. As a result, the base potential of the bias supply transistor 41 becomes unstable at high frequencies.

Inductors 71 and 72 and capacitors 61 and 62 shown in the eleventh embodiment are designed to stabilize, at high frequencies, the base potential of each of the bias supply transistor 41 and a first temperature compensating transistor 42 at high output. An inductor 73 and a capacitor 63 are designed to stabilize, at high frequencies, the collector potential of the first temperature compensating transistor 42 and the collector potential of the bias supply transistor 41.

It is possible to suppress a high-frequency-induced voltage drop of the resistor 51 and suppress variations in the bias voltage caused by variations in the base voltage of the bias supply transistor 41 by absorbing the variations in a current through series-resonance-based charging and discharging of the electric charges of the inductor 71 and the capacitor 61, the inductor 72 and the capacitor 62, and the inductor 73 and the capacitor 63. As a result, it is possible to suppress a drop of the operating point of the high-frequency power amplifying transistor 31 at high output and suppress degradation of linearity due to gain compression.

Twelfth Embodiment

Figure 13:
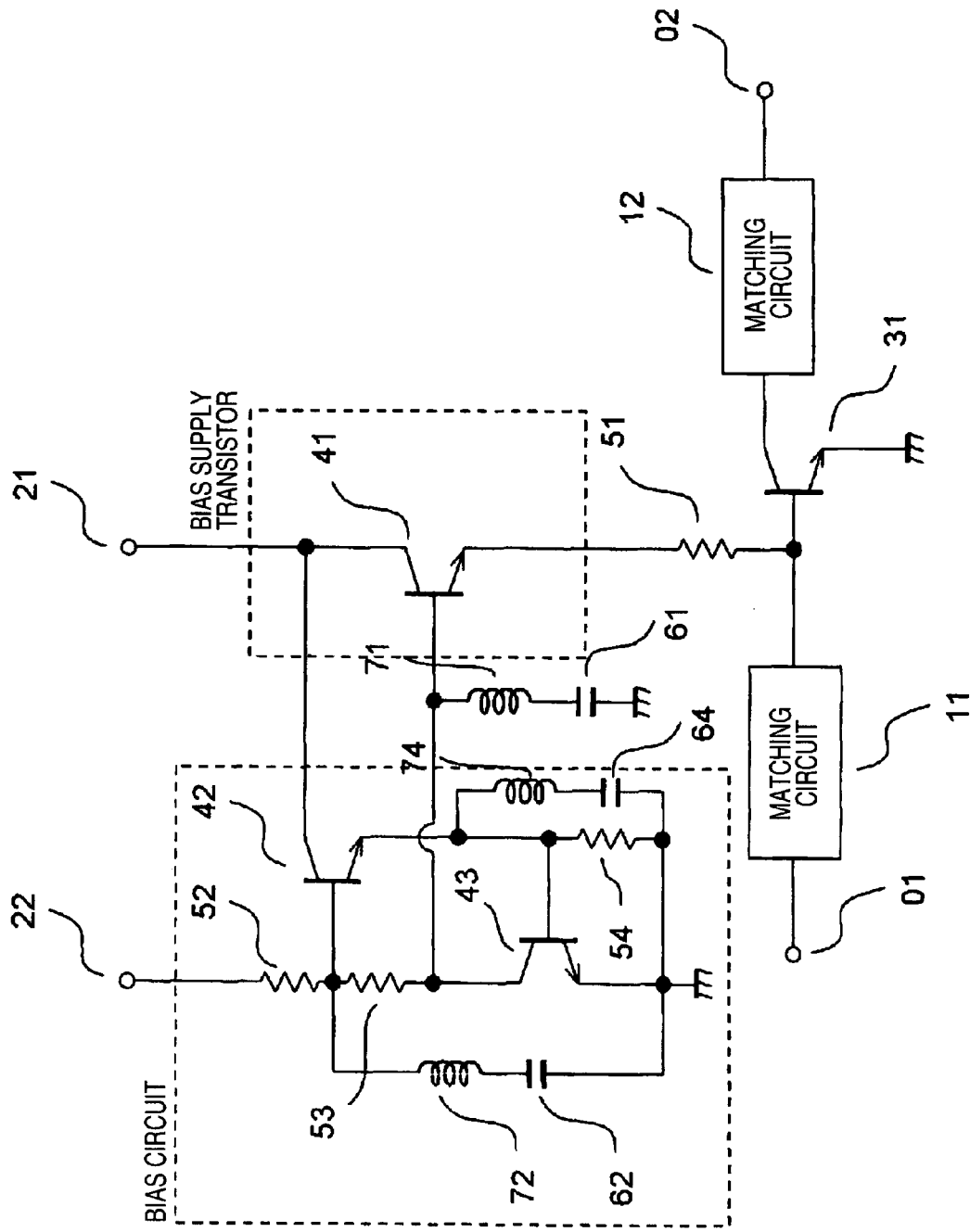
FIG. 13 is a circuit diagram showing the configuration of a high-frequency power amplifier according to the twelfth embodiment of the invention.

FIG. 13 is a circuit diagram of a high-frequency power amplifier according to the twelfth embodiment of the invention. In the high-frequency power amplifier shown in FIG. 13, a resistor 53 is connected between the base of a bias supply transistor 41 and the base of a first temperature compensating transistor in order to suppress variations in the power voltage.

In this bias circuit, a signal inputted from an input signal terminal 01 is amplified by a high-frequency power amplifying transistor 31 and outputted to a signal terminal 02 via a matching circuit 12. In the high-output operation, the power amplitude of the base of the high-frequency power amplifying transistor 31 increases and the signal leaks into the base of a bias supply transistor 41 via a resistor 51. As a result, the base potential of the bias supply transistor 41 becomes unstable at high frequencies.

Inductors 71 and 72 and capacitors 61 and 62 shown in the twelfth embodiment are designed to stabilize, at high frequencies, the base potential of each of the bias supply transistor 41 and a first temperature compensating transistor 42 at high output. An inductor 74 and a capacitor 64 are designed to stabilize, at high frequencies, the base potential of a second temperature compensating transistor 43.

It is possible to suppress a high-frequency-induced voltage drop of the resistor 51 and suppress variations in the bias voltage caused by variations in the base voltage of the bias supply transistor 41 by absorbing the variations in a current through series-resonance-based charging and discharging of the electric charges of the inductor 71 and the capacitor 61, the inductor 72 and the capacitor 62, and the inductor 74 and the capacitor 64. As a result, it is possible to suppress a drop of the operating point of the high-frequency power amplifying transistor 31 at high output and suppress degradation of linearity due to gain compression.

Thirteenth Embodiment

Figure 14:
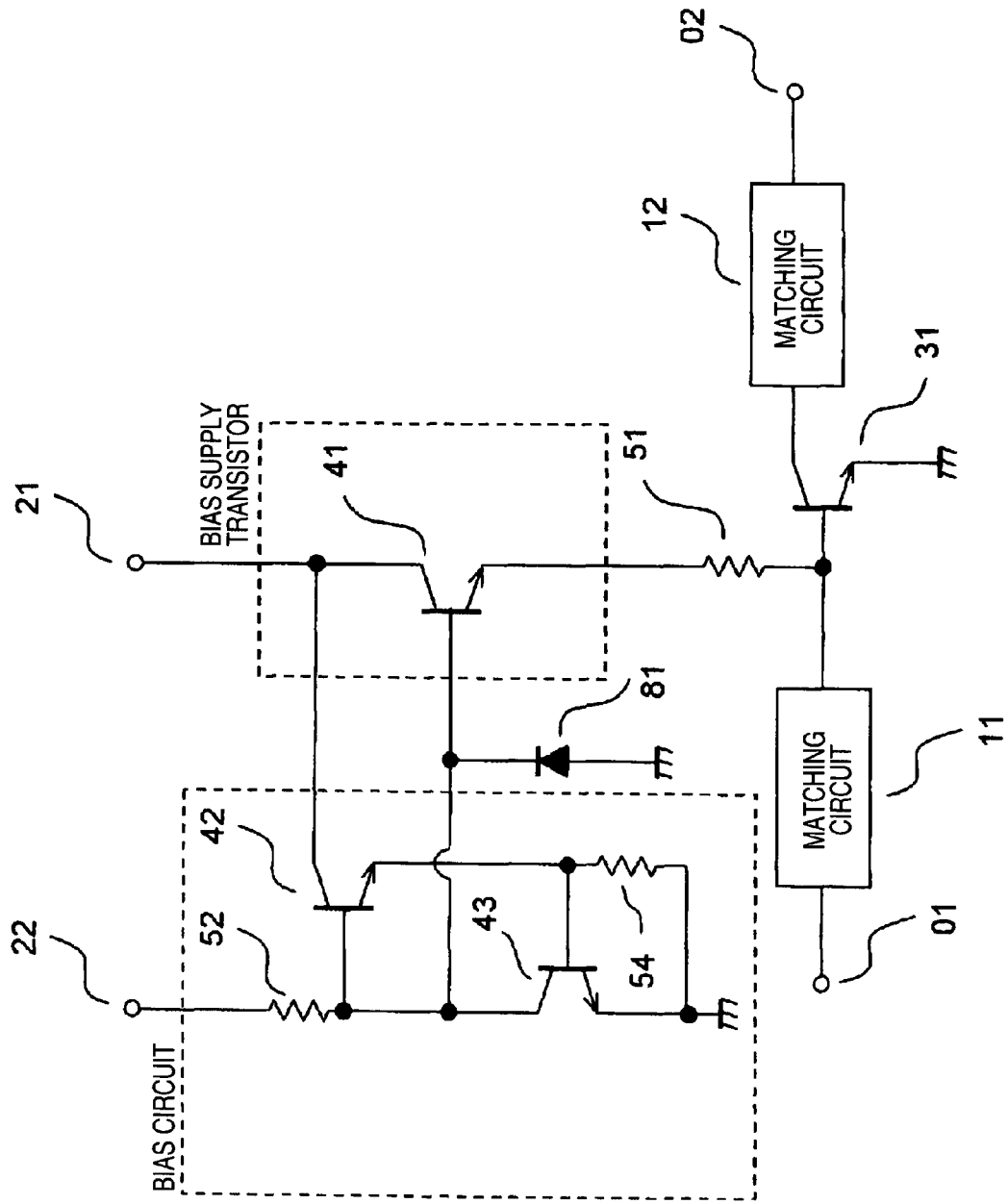
FIG. 14 is a circuit diagram showing the configuration of a high-frequency power amplifier according to the thirteenth embodiment of the invention.

FIG. 14 is a circuit diagram of a high-frequency power amplifier according to the thirteenth embodiment of the invention. A numeral 01 represents an input terminal of a high-frequency power amplifier and 02 an output terminal. A numeral 31 is a high-frequency power amplifying transistor. Between the high-frequency power amplifying transistor 31 and the input terminal 01 and output terminal 02 of the high-frequency power amplifier are respectively connected a matching circuit 11 on the input side and a matching circuit 12 on the output side.

A numeral 41 represents a bias supply transistor that is connected to the base of the high-frequency power amplifying transistor 31 via a resistor 51. The resistor 51 is used to suppress thermal runaway. A bias circuit is composed of temperature compensating transistors 42, 43 and resistors 52, 54.

A first temperature compensating transistor 42 feeds a current corresponding to the voltage supplied to a bias current supply terminal 22. A second temperature compensating transistor 43 compensates for the temperature characteristic of the base voltage of the bias supply transistor 41 by correcting the bias current supplied from the bias supply transistor 41 to the high-frequency power amplifying transistor 31 in accordance with the current flowing into the first temperature compensating transistor 42.

In this bias circuit, a signal inputted from an input signal terminal 01 is amplified by a high-frequency power amplifying transistor 31 and outputted to a signal terminal 02 via a matching circuit 12. In the high-output operation, the power amplitude of the base of the high-frequency power amplifying transistor 31 increases and the signal leaks into the base of a bias supply transistor 41 via a resistor 51. As a result, the base potential of the bias supply transistor 41 becomes unstable at high frequencies.

A diode 81 shown in the thirteenth embodiment is designed to stabilize, at high frequencies, the base potential of the bias supply transistor 41 at high output. Even in the presence of high-frequency-induced variations in a base current of the bias supply transistor 41, the high-frequency-induced voltage drop of the resistor 51 and variations in the bias voltage caused by variations in the base voltage of the bias supply transistor 41 are suppressed by absorbing the variations in a current through charging and discharging of the electric charges by way of the junction capacitance of the diode 81. Adding a diode short in reverse recovery time delivers a further rectifying effect. As a result, it is possible to suppress a drop of the operating point of the high-frequency power amplifying transistor 31 at high output and suppress degradation of linearity due to gain compression.

Fourteenth Embodiment

Figure 15:
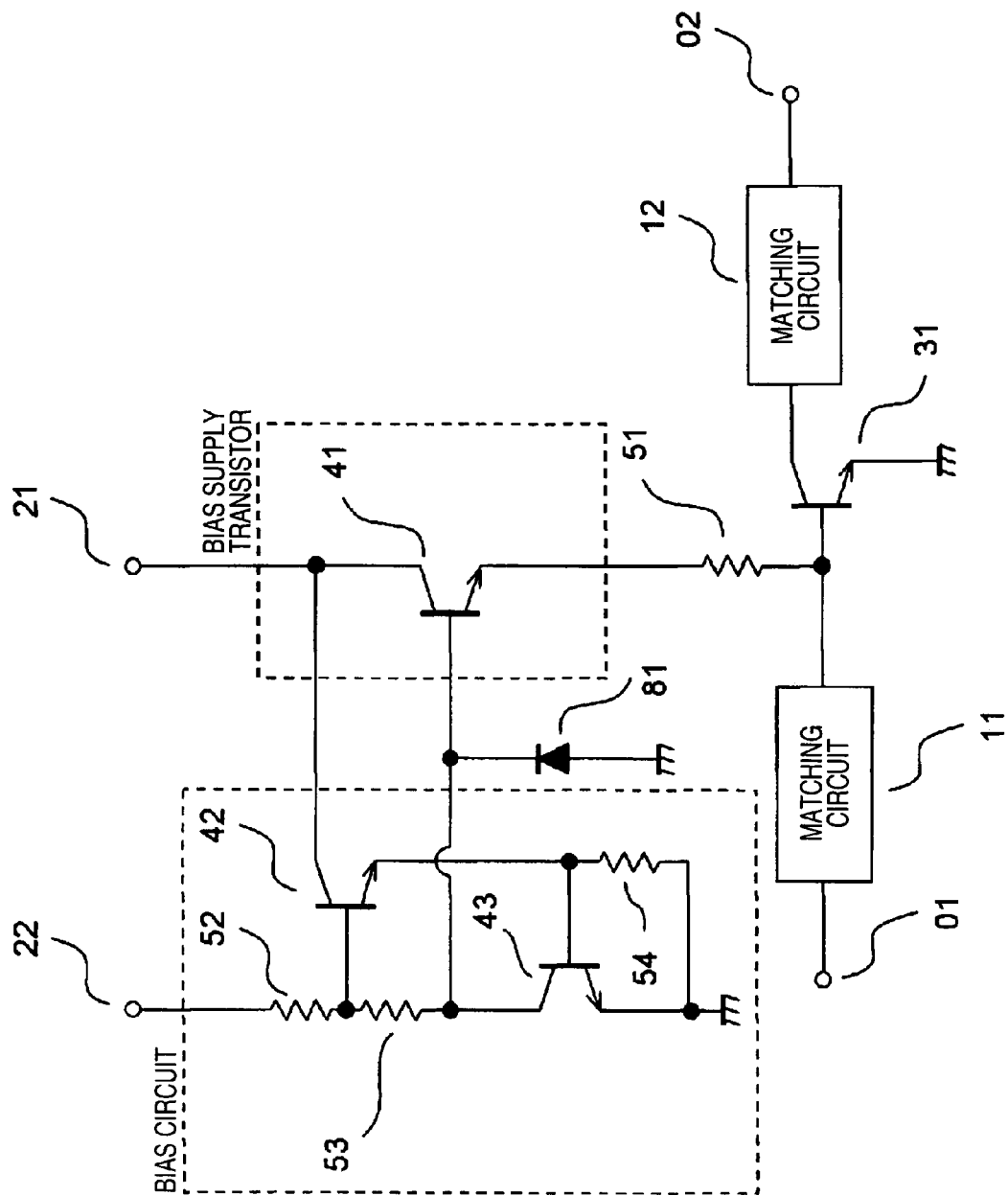
FIG. 15 is a circuit diagram showing the configuration of a high-frequency power amplifier according to the fourteenth embodiment of the invention.

FIG. 15 is a circuit diagram of a high-frequency power amplifier according to the fourteenth embodiment of the invention. In the high-frequency power amplifier shown in FIG. 15, a resistor 53 is connected between the base of a bias supply transistor 41 and the base of a first temperature compensating transistor in order to suppress variations in the power voltage.

In this bias circuit, a signal inputted from an input signal terminal 01 is amplified by a high-frequency power amplifying transistor 31 and outputted to a signal terminal 02 via a matching circuit 12. In the high-output operation, the power amplitude of the base of the high-frequency power amplifying transistor 31 increases and the signal leaks into the base of a bias supply transistor 41 via a resistor 51. As a result, the base potential of the bias supply transistor 41 becomes unstable at high frequencies.

A diode 81 shown in the fourteenth embodiment is designed to stabilize, at high frequencies, the base potential of the bias supply transistor 41 at high output. Even in the presence of high-frequency-induced variations in a base current of the bias supply transistor 41, the high-frequency-induced voltage drop of the resistor 51 and variations in the bias voltage caused by variations in the base voltage of the bias supply transistor 41 are suppressed by absorbing the variations in a current through charging and discharging of the electric charges by way of the junction capacitance of the diode 81. Adding a diode short in reverse recovery time delivers a further rectifying effect. As a result, it is possible to suppress a drop of the operating point of the high-frequency power amplifying transistor 31 at high output and suppress degradation of linearity due to gain compression.

Fifteenth Embodiment

Figure 16:
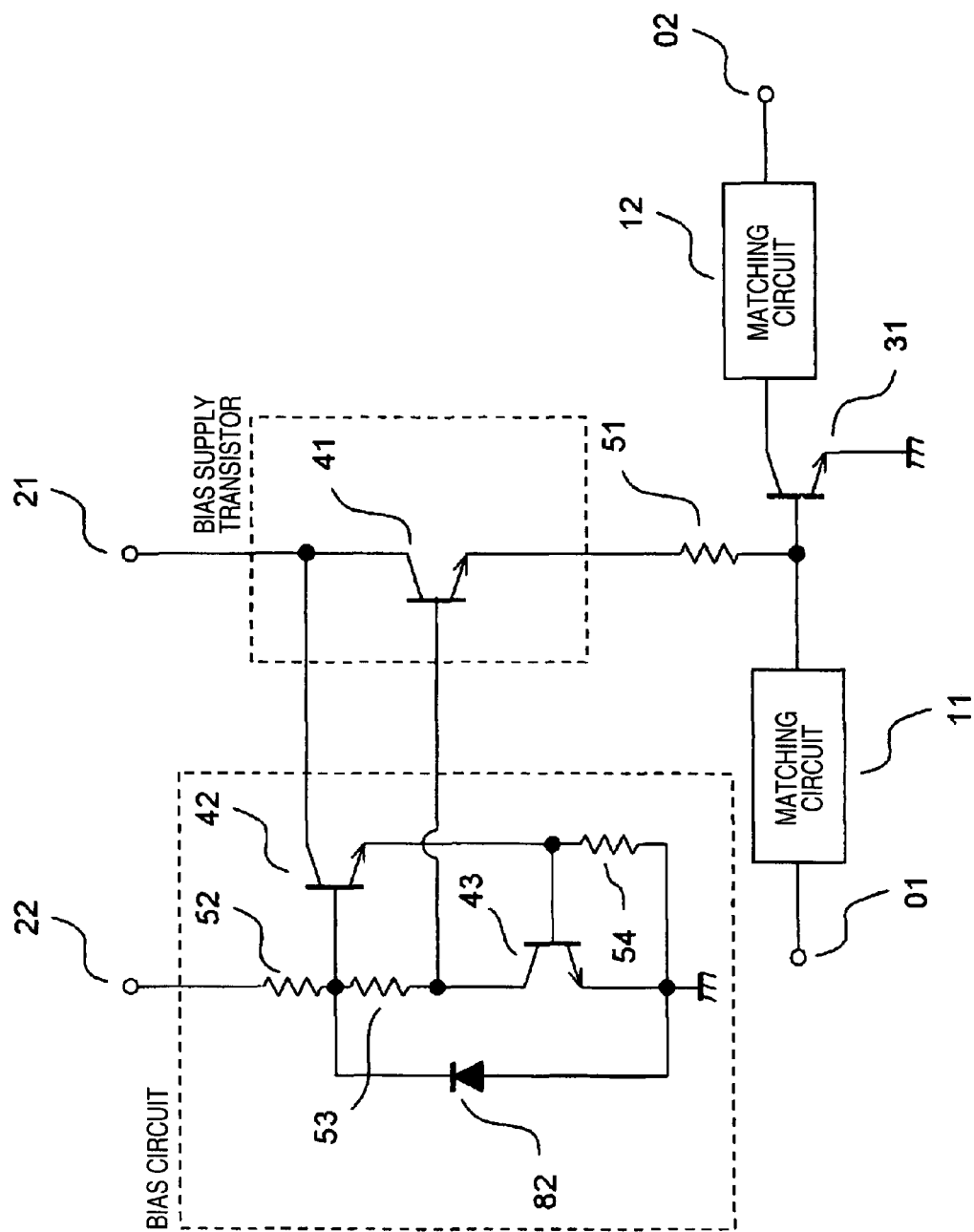
FIG. 16 is a circuit diagram showing the configuration of a high-frequency power amplifier according to the fifteenth embodiment of the invention.

FIG. 16 is a circuit diagram of a high-frequency power amplifier according to the fifteenth embodiment of the invention. In the high-frequency power amplifier shown in FIG. 16, a resistor 53 is connected between the base of a bias supply transistor 41 and the base of a first temperature compensating transistor in order to suppress variations in the power voltage.

In this bias circuit, a signal inputted from an input signal terminal 01 is amplified by a high-frequency power amplifying transistor 31 and outputted to a signal terminal 02 via a matching circuit 12. In the high-output operation, the power amplitude of the base of the high-frequency power amplifying transistor 31 increases and the signal leaks into the base of a bias supply transistor 41 via a resistor 51. As a result, the base potential of the bias supply transistor 41 becomes unstable at high frequencies.

A diode 82 shown in the fifteenth embodiment is designed to stabilize, at high frequencies, the base potential of a first temperature compensating transistor 42 at high output. Even in the presence of high-frequency-induced variations in a base current of the first temperature compensating transistor 42, the high-frequency-induced voltage drop of the resistor 51 and variations in the bias voltage caused by variations in the base voltage of the bias supply transistor 41 are suppressed by absorbing the variations in a current through charging and discharging of the electric charges by way of the junction capacitance of the diode 82. Adding a diode short in reverse recovery time delivers a further rectifying effect. As a result, it is possible to suppress a drop of the operating point of the high-frequency power amplifying transistor 31 at high output and suppress degradation of linearity due to gain compression.

Sixteenth Embodiment

Figure 17:
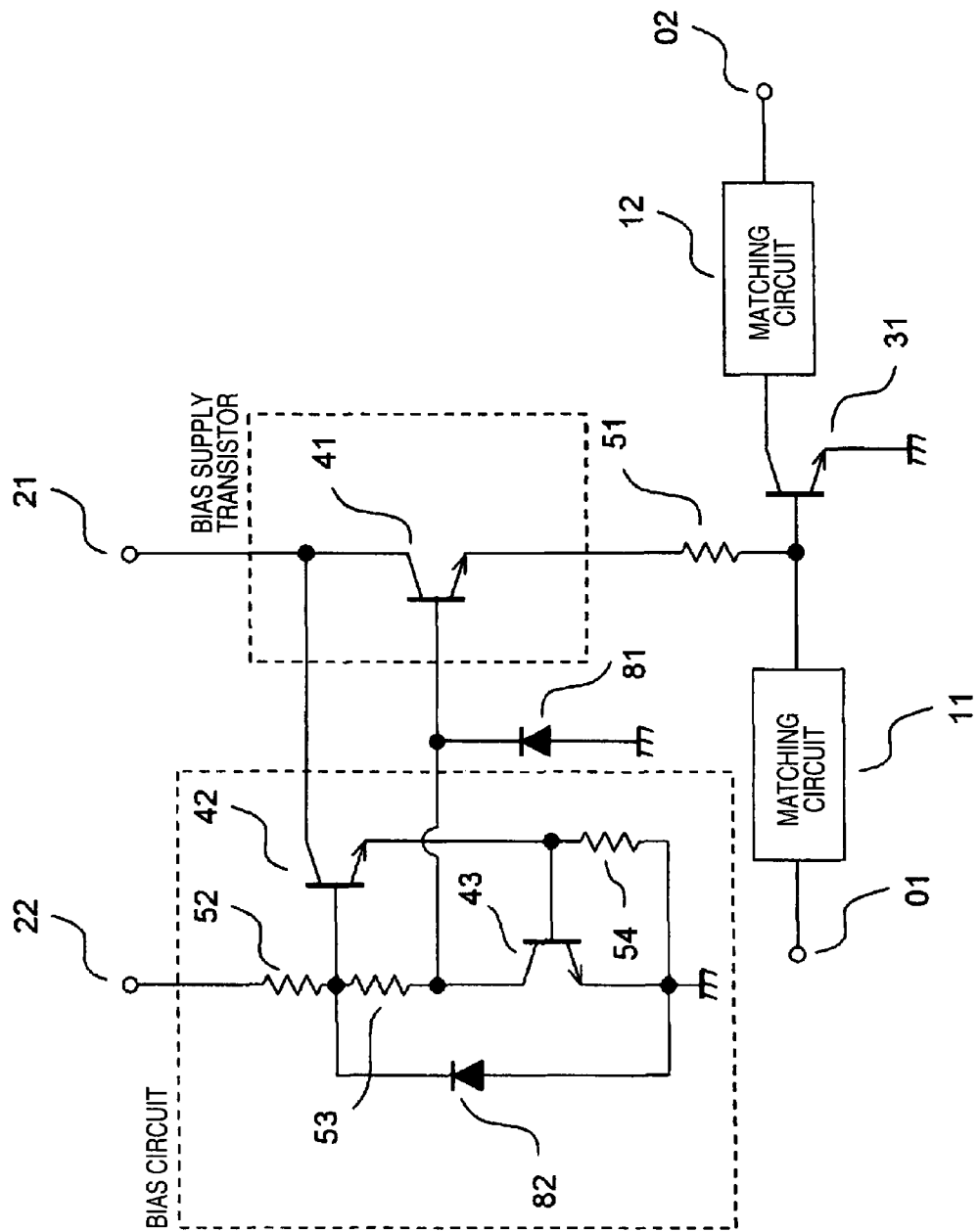
FIG. 17 is a circuit diagram showing the configuration of a high-frequency power amplifier according to the sixteenth embodiment of the invention.

FIG. 17 is a circuit diagram of a high-frequency power amplifier according to the sixteenth embodiment of the invention. In the high-frequency power amplifier shown in FIG. 17, a resistor 53 is connected between the base of a bias supply transistor 41 and the base of a first temperature compensating transistor in order to suppress variations in the power voltage.

In this bias circuit, a signal inputted from an input signal terminal 01 is amplified by a high-frequency power amplifying transistor 31 and outputted to a signal terminal 02 via a matching circuit 12. In the high-output operation, the power amplitude of the base of the high-frequency power amplifying transistor 31 increases and the signal leaks into the base of a bias supply transistor 41 via a resistor 51. As a result, the base potential of the bias supply transistor 41 becomes unstable at high frequencies.

Diodes 81 and 82 shown in the sixteenth embodiment are designed to stabilize, at high frequencies, the base potential of each of the bias supply transistor 41 and a first temperature compensating transistor 42 at high output. Even in the presence of high-frequency-induced variations in a base current of the first temperature compensating transistor 42, the high-frequency-induced voltage drop of the resistor 51 and variations in the bias voltage caused by variations in the base voltage of the bias supply transistor 41 are suppressed by absorbing the variations in a current through charging and discharging of the electric charges by way of the junction capacitance of each of the diodes 81 and 82. Adding a diode short in reverse recovery time delivers a further rectifying effect. As a result, it is possible to suppress a drop of the operating point of the high-frequency power amplifying transistor 31 at high output and suppress degradation of linearity due to gain compression.

Seventeenth Embodiment

Figure 18:
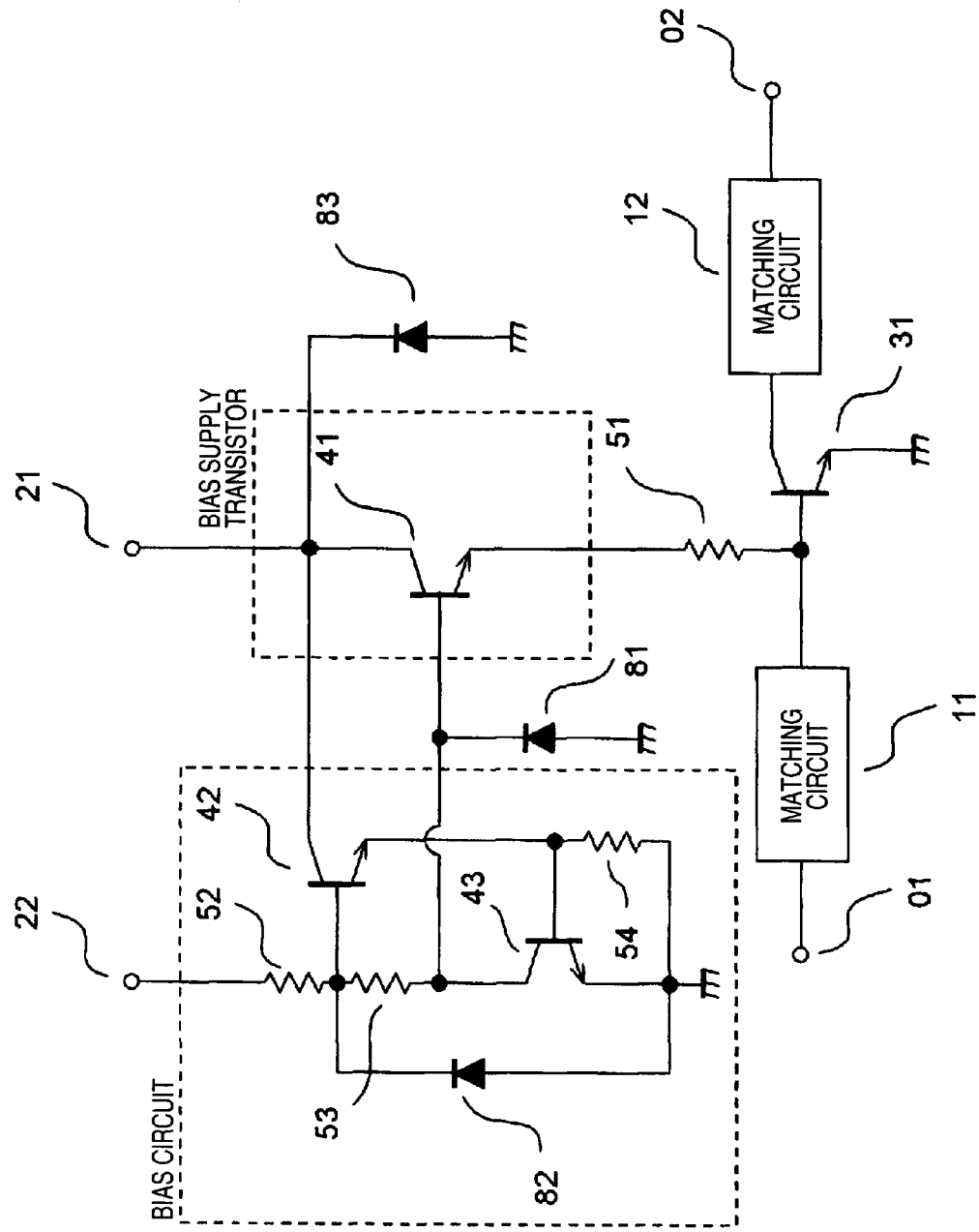
FIG. 18 is a circuit diagram showing the configuration of a high-frequency power amplifier according to the seventeenth embodiment of the invention.

FIG. 18 is a circuit diagram of a high-frequency power amplifier according to the seventeenth embodiment of the invention. In the high-frequency power amplifier shown in FIG. 18, a resistor 53 is connected between the base of a bias supply transistor 41 and the base of a first temperature compensating transistor in order to suppress variations in the power voltage.

In this bias circuit, a signal inputted from an input signal terminal 01 is amplified by a high-frequency power amplifying transistor 31 and outputted to a signal terminal 02 via a matching circuit 12. In the high-output operation, the power amplitude of the base of the high-frequency power amplifying transistor 31 increases and the signal leaks into the base of a bias supply transistor 41 via a resistor 51. As a result, the base potential of the bias supply transistor 41 becomes unstable at high frequencies.

Diodes 81 and 82 shown in the seventeenth embodiment are designed to stabilize, at high frequencies, the base potential of each of the bias supply transistor 41 and a first temperature compensating transistor 42 at high output. A diode 83 is designed to stabilize, at high frequencies, the collector potential of the first temperature compensating transistor 42 and the collector potential of the bias supply transistor 41.

The high-frequency-induced voltage drop of the resistor 51 and variations in the bias voltage caused by variations in the base voltage of the bias supply transistor 41 are suppressed by absorbing the variations in a current through charging and discharging of the electric charges by way of the junction capacitance of each of the diodes 81, 82 and 83. Adding a diode short in reverse recovery time delivers a further rectifying effect. As a result, it is possible to suppress a drop of the operating point of the high-frequency power amplifying transistor 31 at high output and suppress degradation of linearity due to gain compression.

Eighteenth Embodiment

Figure 19:
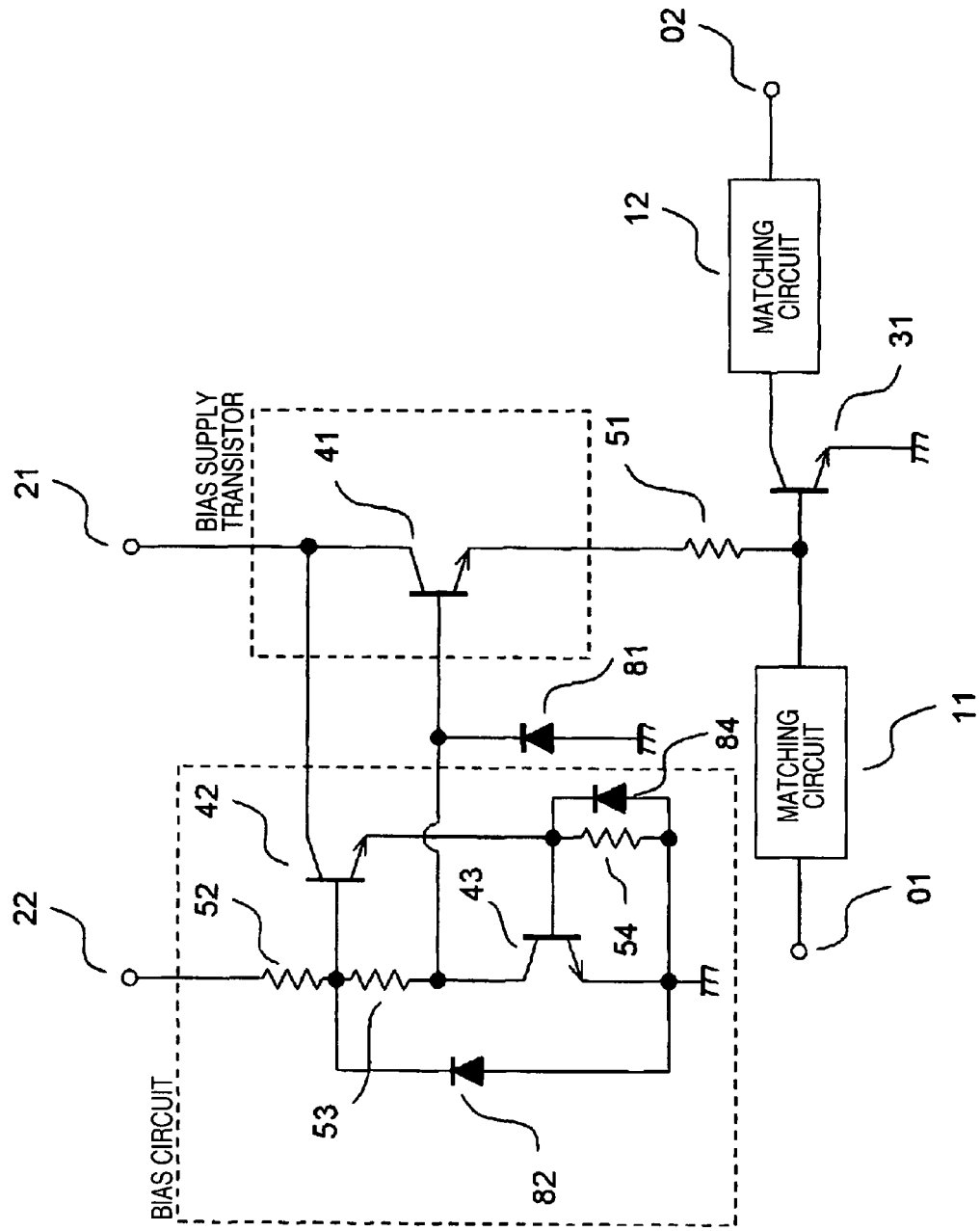
FIG. 19 is a circuit diagram showing the configuration of a high-frequency power amplifier according to the eighteenth embodiment of the invention.

FIG. 19 is a circuit diagram of a high-frequency power amplifier according to the eighteenth embodiment of the invention. In the high-frequency power amplifier shown in FIG. 19, a resistor 53 is connected between the base of a bias supply transistor 41 and the base of a first temperature compensating transistor in order to suppress variations in the power voltage.

In this bias circuit, a signal inputted from an input signal terminal 01 is amplified by a high-frequency power amplifying transistor 31 and outputted to a signal terminal 02 via a matching circuit 12. In the high-output operation, the power amplitude of the base of the high-frequency power amplifying transistor 31 increases and the signal leaks into the base of a bias supply transistor 41 via a resistor 51. As a result, the base potential of the bias supply transistor 41 becomes unstable at high frequencies.

Diodes 81 and 82 shown in the seventeenth embodiment are designed to stabilize, at high frequencies, the base potential of each of the bias supply transistor 41 and a first temperature compensating transistor 42 at high output. In case the base potential of a second temperature compensating transistor 43 is unstable, the amplitude of the current of a collector is also unstable. Addition of a diode 84 can stabilize the base potential at high frequencies.

The high-frequency-induced voltage drop of the resistor 51 and variations in the bias voltage caused by variations in the base voltage of the bias supply transistor 41 are suppressed by absorbing the variations in a current through charging and discharging of the electric charges by way of the junction capacitance of each of the diodes 81, 82 and 84. Adding a diode short in reverse recovery time delivers a further rectifying effect. As a result, it is possible to suppress a drop of the operating point of the high-frequency power amplifying transistor 31 at high output and suppress degradation of linearity due to gain compression.

Nineteenth Embodiment

Figure 20:
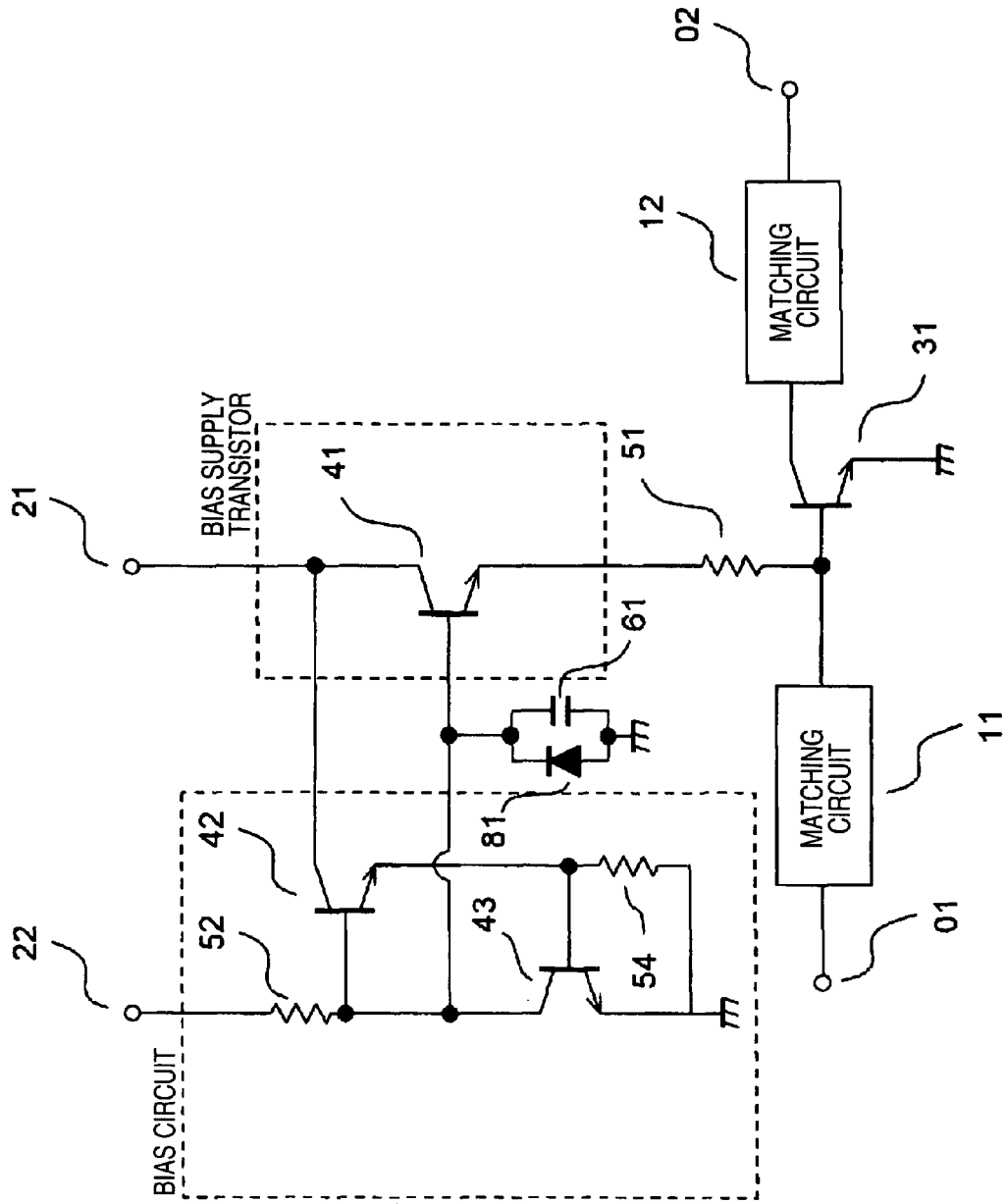
FIG. 20 is a circuit diagram showing the configuration of a high-frequency power amplifier according to the nineteenth embodiment of the invention.

FIG. 20 is a circuit diagram of a high-frequency power amplifier according to the nineteenth embodiment of the invention. A numeral 01 represents an input terminal of a high-frequency power amplifier and 02 an output terminal. A numeral 31 is a high-frequency power amplifying transistor. Between the high-frequency power amplifying transistor 31 and the input terminal 01 and output terminal 02 of the high-frequency power amplifier are respectively connected a matching circuit 11 on the input side and a matching circuit 12 on the output side.

A numeral 41 represents a bias supply transistor that is connected to the base of the high-frequency power amplifying transistor 31 via a resistor 51. The resistor 51 is used to suppress thermal runaway. A bias circuit is composed of temperature compensating transistors 42, 43 and resistors 52, 54.

A first temperature compensating transistor 42 feeds a current corresponding to the voltage supplied to a bias current supply terminal 22. A second temperature compensating transistor 43 compensates for the temperature characteristic of the base voltage of the bias supply transistor 41 by correcting the bias current supplied from the bias supply transistor 41 to the high-frequency power amplifying transistor 31 in accordance with the current flowing into the first temperature compensating transistor 42.

In this bias circuit, a signal inputted from an input signal terminal 01 is amplified by a high-frequency power amplifying transistor 31 and outputted to a signal terminal 02 via a matching circuit 12. In the high-output operation, the power amplitude of the base of the high-frequency power amplifying transistor 31 increases and the signal leaks into the base of a bias supply transistor 41 via a resistor 51. As a result, the base potential of the bias supply transistor 41 becomes unstable at high frequencies.

A diode 81 and a capacitor 61 shown in the nineteenth embodiment are designed to stabilize, at high frequencies, the base potential of the bias supply transistor 41 at high output. Even in the presence of high-frequency-induced variations in a base current of the bias supply transistor 41, the high-frequency-induced voltage drop of the resistor 51 and variations in the bias voltage caused by variations in the base voltage of the bias supply transistor 41 are suppressed by absorbing the variations in a current through charging and discharging of the electric charges of the diode 81 and the capacitor 61. Adding a diode short in reverse recovery time delivers a further rectifying effect. As a result, it is possible to suppress a drop of the operating point of the high-frequency power amplifying transistor 31 at high output and suppress degradation of linearity due to gain compression.

Twentieth Embodiment

Figure 21:
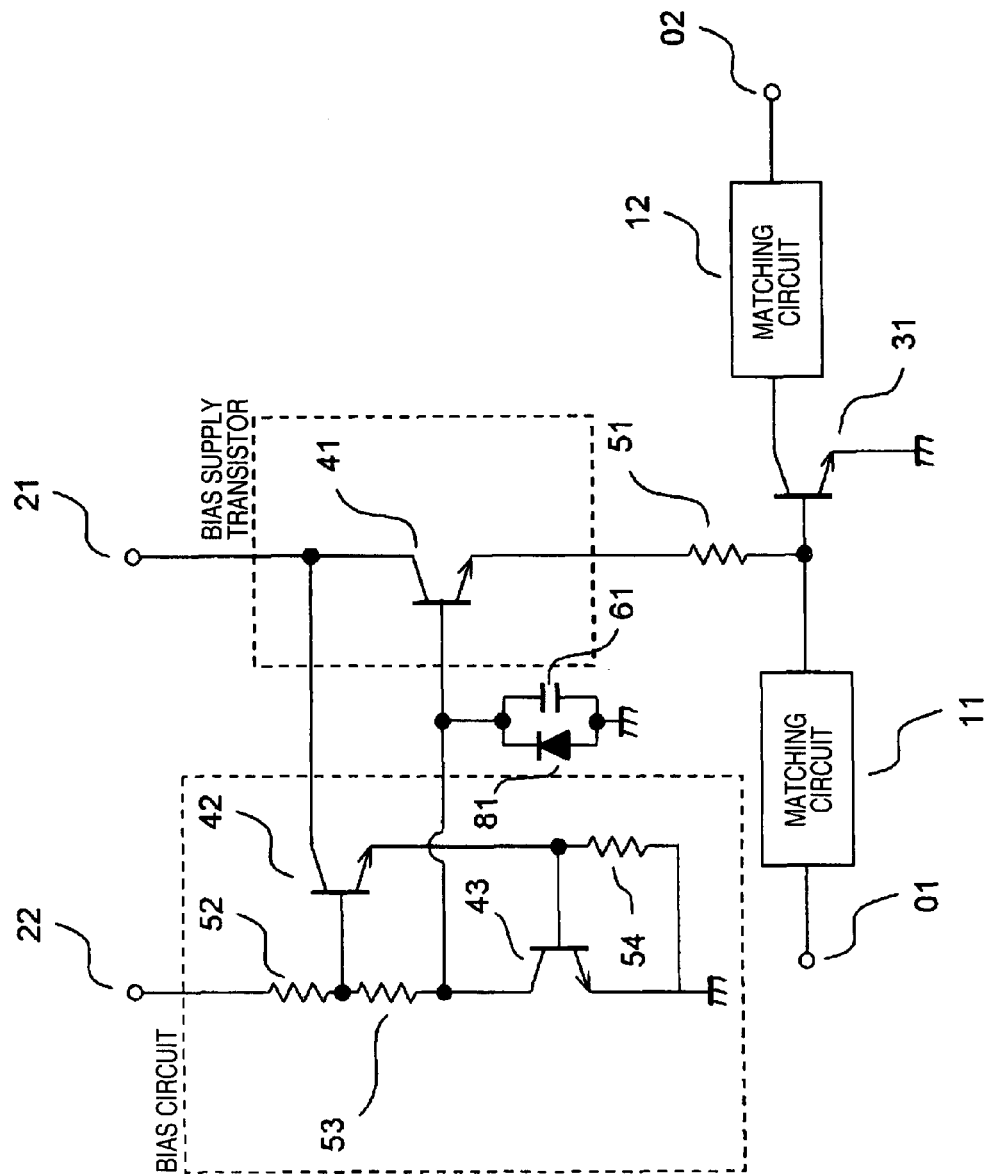
FIG. 21 is a circuit diagram showing the configuration of a high-frequency power amplifier according to the twentieth embodiment of the invention.

FIG. 21 is a circuit diagram of a high-frequency power amplifier according to the twentieth embodiment of the invention. In the high-frequency power amplifier shown in FIG. 21, a resistor 53 is connected between the base of a bias supply transistor 41 and the base of a first temperature compensating transistor in order to suppress variations in the power voltage.

In this bias circuit, a signal inputted from an input signal terminal 01 is amplified by a high-frequency power amplifying transistor 31 and outputted to a signal terminal 02 via a matching circuit 12. In the high-output operation, the power amplitude of the base of the high-frequency power amplifying transistor 31 increases and the signal leaks into the base of a bias supply transistor 41 via a resistor 51. As a result, the base potential of the bias supply transistor 41 becomes unstable at high frequencies.

A diode 81 and a capacitor 61 shown in the twentieth embodiment are designed to stabilize, at high frequencies, the base potential of the bias supply transistor 41 at high output. Even in the presence of high-frequency-induced variations in a base current of the bias supply transistor 41, the high-frequency-induced voltage drop of the resistor 51 and variations in the bias voltage caused by variations in the base voltage of the bias supply transistor 41 are suppressed by absorbing the variations in a current through charging and discharging of the electric charges of the diode 81 and the capacitor 61. Adding a diode short in reverse recovery time delivers a further rectifying effect. As a result, it is possible to suppress a drop of the operating point of the high-frequency power amplifying transistor 31 at high output and suppress degradation of linearity due to gain compression.

Twenty-First Embodiment

Figure 22:
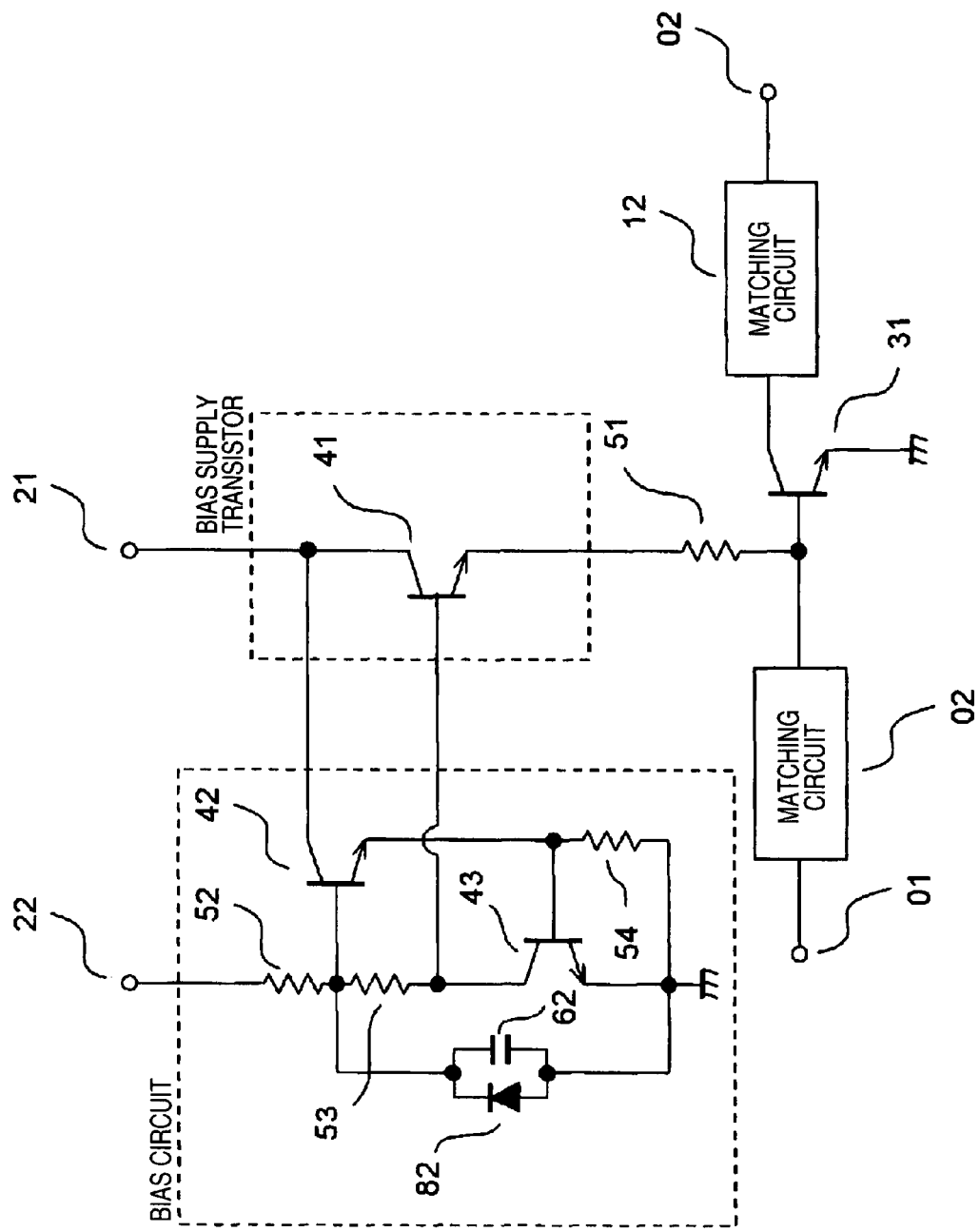
FIG. 22 is a circuit diagram showing the configuration of a high-frequency power amplifier according to the twenty-first embodiment of the invention.

FIG. 22 is a circuit diagram of a high-frequency power amplifier according to the twenty-first embodiment of the invention. In the high-frequency power amplifier shown in FIG. 22, a resistor 53 is connected between the base of a bias supply transistor 41 and the base of a first temperature compensating transistor in order to suppress variations in the power voltage.

In this bias circuit, a signal inputted from an input signal terminal 01 is amplified by a high-frequency power amplifying transistor 31 and outputted to a signal terminal 02 via a matching circuit 12. In the high-output operation, the power amplitude of the base of the high-frequency power amplifying transistor 31 increases and the signal leaks into the base of a bias supply transistor 41 via a resistor 51. As a result, the base potential of the bias supply transistor 41 becomes unstable at high frequencies.

A diode 82 and a capacitor 62 shown in the twenty-first embodiment are designed to stabilize, at high frequencies, the base potential of a first temperature compensating transistor 42 at high output. Even in the presence of high-frequency-induced variations in a base current of the first temperature compensating transistor 42, the high-frequency-induced voltage drop of the resistor 51 and variations in the bias voltage caused by variations in the base voltage of the bias supply transistor 41 are suppressed by absorbing the variations in a current through charging and discharging of the electric charges of the diode 82 and the capacitor 62. Adding a diode short in reverse recovery time delivers a further rectifying effect. As a result, it is possible to suppress a drop of the operating point of the high-frequency power amplifying transistor 31 at high output and suppress degradation of linearity due to gain compression.

Twenty-Second Embodiment

Figure 23:
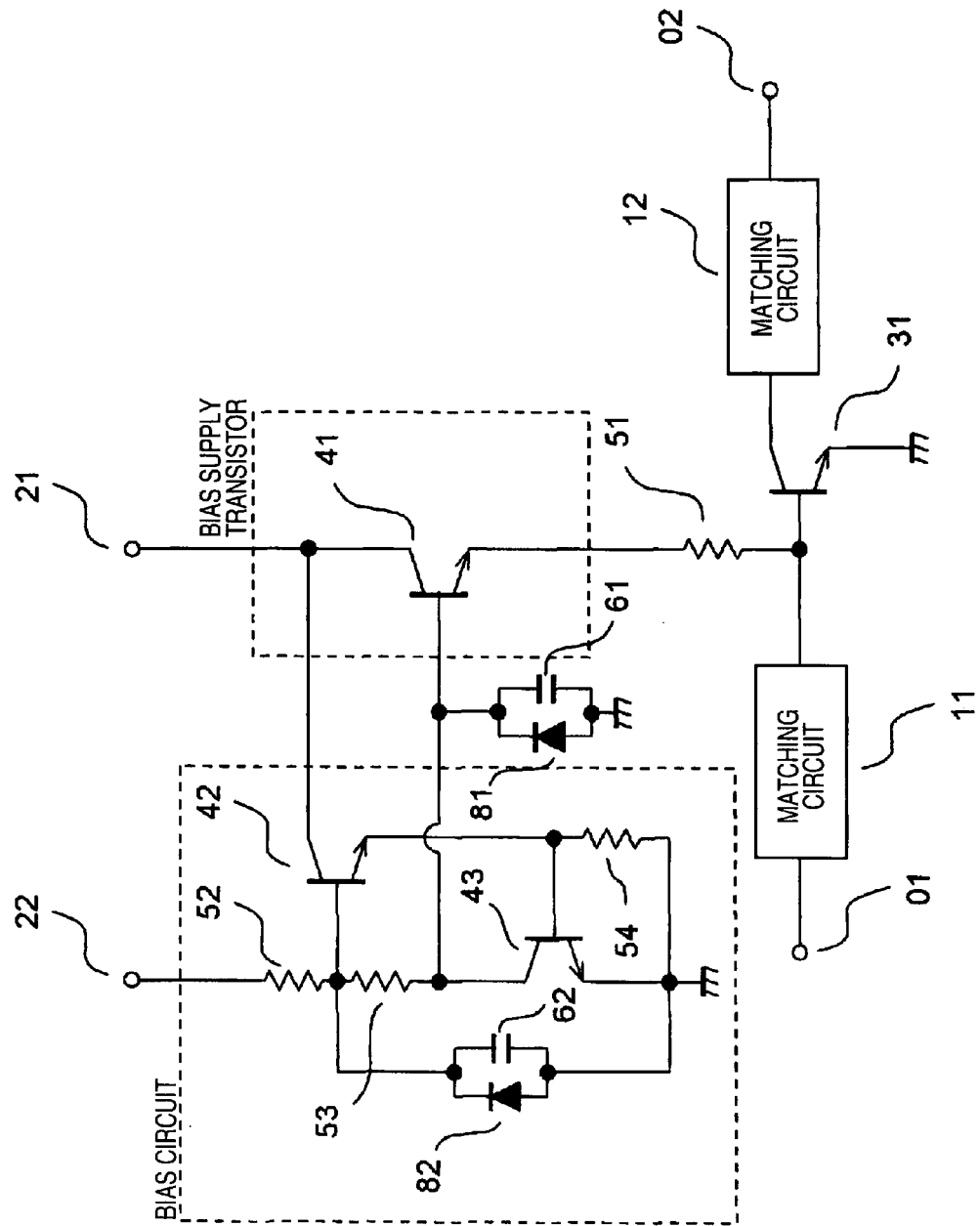
FIG. 23 is a circuit diagram showing the configuration of a high-frequency power amplifier according to the twenty-second embodiment of the invention.

FIG. 23 is a circuit diagram of a high-frequency power amplifier according to the twenty-second embodiment of the invention. In the high-frequency power amplifier shown in FIG. 23, a resistor 53 is connected between the base of a bias supply transistor 41 and the base of a first temperature compensating transistor in order to suppress variations in the power voltage.

In this bias circuit, a signal inputted from an input signal terminal 01 is amplified by a high-frequency power amplifying transistor 31 and outputted to a signal terminal 02 via a matching circuit 12. In the high-output operation, the power amplitude of the base of the high-frequency power amplifying transistor 31 increases and the signal leaks into the base of a bias supply transistor 41 via a resistor 51. As a result, the base potential of the bias supply transistor 41 becomes unstable at high frequencies.

Diodes 81 and 82 and capacitors 61 and 62 shown in the twenty-second embodiment are designed to stabilize, at high frequencies, the base potential of the bias supply transistor 41 and a first temperature compensating transistor 42 at high output. The high-frequency-induced voltage drop of the resistor 51 and variations in the bias voltage caused by variations in the base voltage of the bias supply transistor 41 are suppressed by absorbing the variations in a current through charging and discharging of the electric charges of the diodes 81 and 82 and the capacitors 61 and 62. Adding a diode short in reverse recovery time delivers a further rectifying effect. As a result, it is possible to suppress a drop of the operating point of the high-frequency power amplifying transistor 31 at high output and suppress degradation of linearity due to gain compression.

Twenty-Third Embodiment

Figure 24:
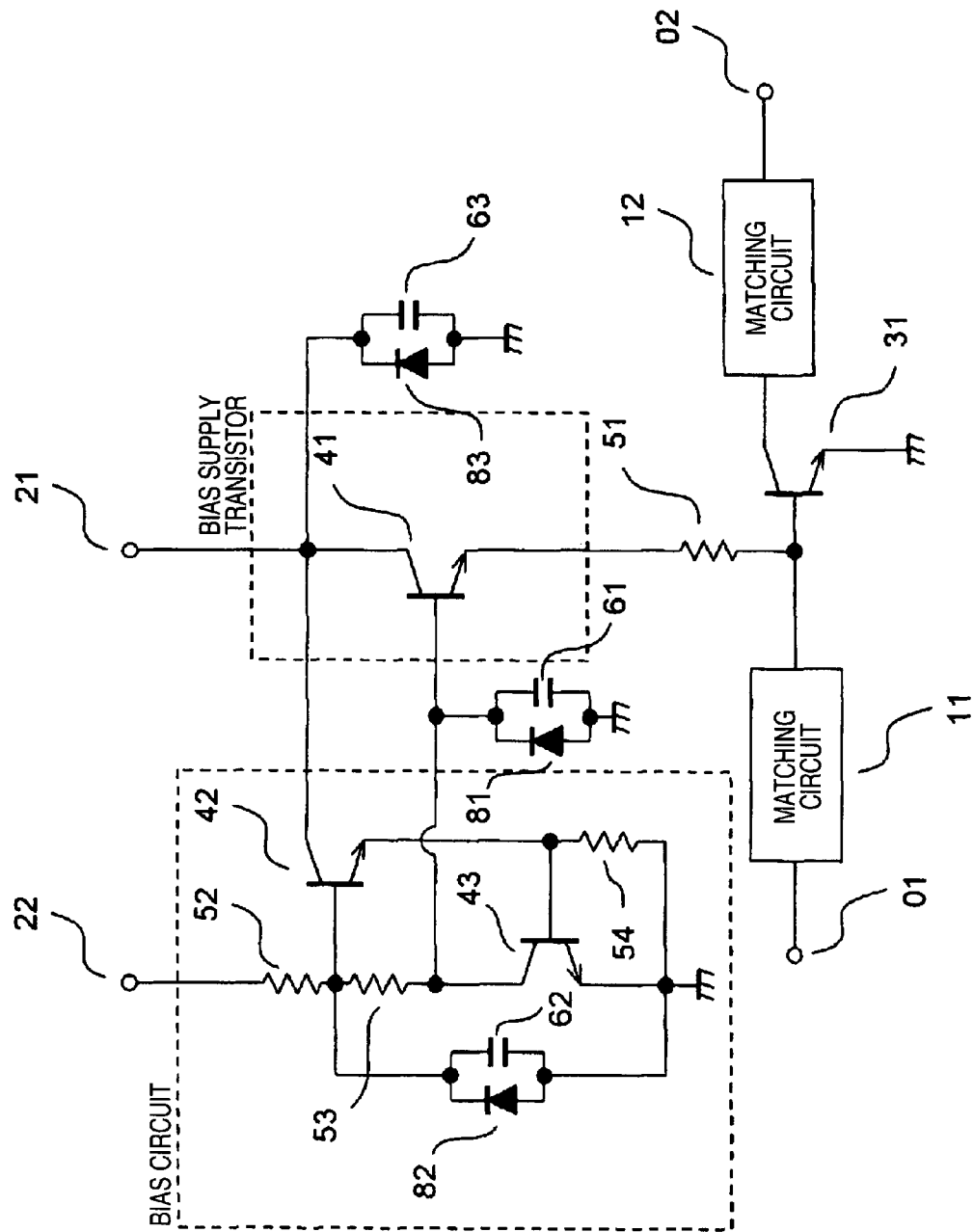
FIG. 24 is a circuit diagram showing the configuration of a high-frequency power amplifier according to the twenty-third embodiment of the invention.

FIG. 24 is a circuit diagram of a high-frequency power amplifier according to the twenty-third embodiment of the invention. In the high-frequency power amplifier shown in FIG. 24, a resistor 53 is connected between the base of a bias supply transistor 41 and the base of a first temperature compensating transistor in order to suppress variations in the power voltage.

In this bias circuit, a signal inputted from an input signal terminal 01 is amplified by a high-frequency power amplifying transistor 31 and outputted to a signal terminal 02 via a matching circuit 12. In the high-output operation, the power amplitude of the base of the high-frequency power amplifying transistor 31 increases and the signal leaks into the base of a bias supply transistor 41 via a resistor 51. As a result, the base potential of the bias supply transistor 41 becomes unstable at high frequencies.

Diodes 81 and 82 and capacitors 61 and 62 shown in the twenty-second embodiment are designed to stabilize, at high frequencies, the base potential of each of the bias supply transistor 41 and a first temperature compensating transistor 42 at high output. A diode 83 and a capacitor 63 are designed to stabilize, at high frequencies, the collector potential of the first temperature compensating transistor 42 and the collector potential of the bias supply transistor 41.

The high-frequency-induced voltage drop of the resistor 51 and variations in the bias voltage caused by variations in the base voltage of the bias supply transistor 41 are suppressed by absorbing the variations in a current through charging and discharging of the electric charges of the diodes 81, 82 and 83 and the capacitors 61, 62 and 63. Adding a diode short in reverse recovery time delivers a further rectifying effect. As a result, it is possible to suppress a drop of the operating point of the high-frequency power amplifying transistor 31 at high output and suppress degradation of linearity due to gain compression.

Twenty-Fourth Embodiment

Figure 25:
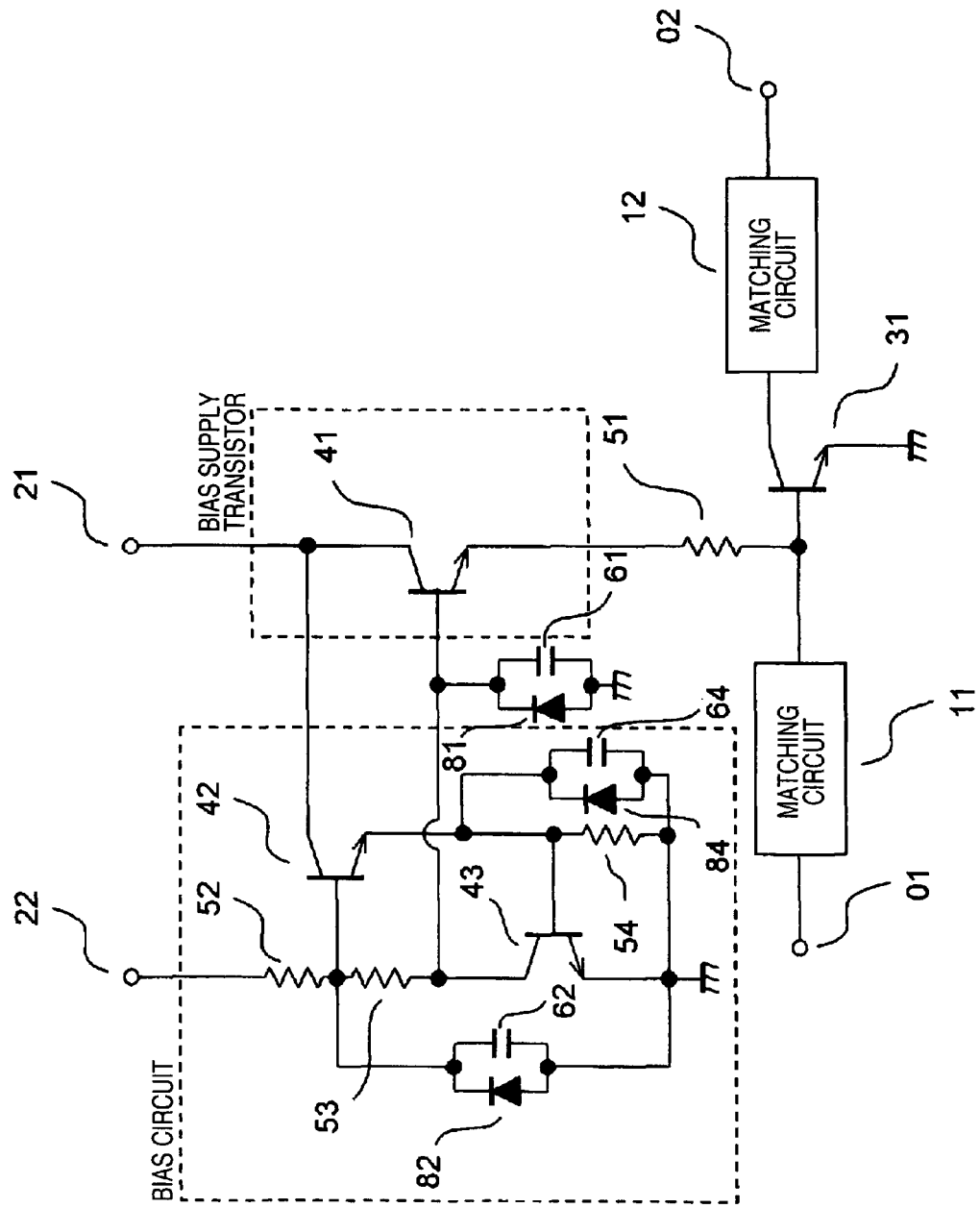
FIG. 25 is a circuit diagram showing the configuration of a high-frequency power amplifier according to the twenty-fourth embodiment of the invention.

FIG. 25 is a circuit diagram of a high-frequency power amplifier according to the twenty-fourth embodiment of the invention. In the high-frequency power amplifier shown in FIG. 25, a resistor 53 is connected between the base of a bias supply transistor 41 and the base of a first temperature compensating transistor in order to suppress variations in the power voltage.

In this bias circuit, a signal inputted from an input signal terminal 01 is amplified by a high-frequency power amplifying transistor 31 and outputted to a signal terminal 02 via a matching circuit 12. In the high-output operation, the power amplitude of the base of the high-frequency power amplifying transistor 31 increases and the signal leaks into the base of a bias supply transistor 41 via a resistor 51. As a result, the base potential of the bias supply transistor 41 becomes unstable at high frequencies.

Diodes 81 and 82 and capacitors 61 and 62 shown in the twenty-fourth embodiment are designed to stabilize, at high frequencies, the base potential of each of the bias supply transistor 41 and a first temperature compensating transistor 42 at high output. In case the base potential of a second temperature compensating transistor 43 is unstable, the amplitude of the current of a collector is also unstable. Addition of a diode 84 and a capacitor 64 can stabilize the base potential at high frequencies. The high-frequency-induced voltage drop of the resistor 51 and variations in the bias voltage caused by variations in the base voltage of the bias supply transistor 41 are suppressed by absorbing the variations in a current through charging and discharging of the electric charges of the diodes 81, 82 and 84 and the capacitors 61, 62 and 64. Adding a diode short in reverse recovery time delivers a further rectifying effect. As a result, it is possible to suppress a drop of the operating point of the high-frequency power amplifying transistor 31 at high output and suppress degradation of linearity due to gain compression.

Twenty-Fifth Embodiment

Figure 26:
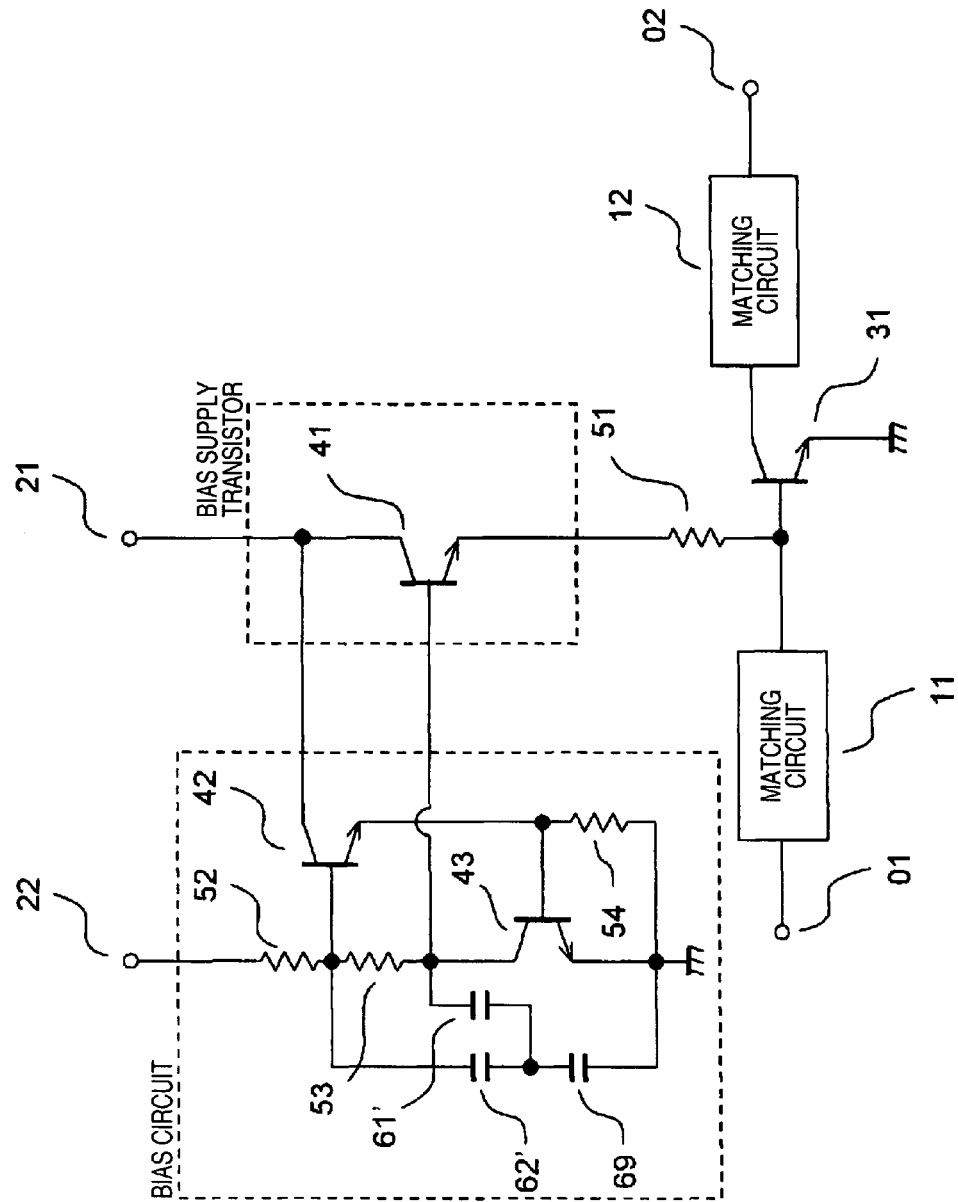
FIG. 26 is a circuit diagram showing the configuration of a high-frequency power amplifier according to the twenty-fifth embodiment of the invention.

FIG. 26 is a circuit diagram of a high-frequency power amplifier according to the twenty-fifth embodiment of the invention. In the high-frequency power amplifier shown in FIG. 26, a resistor 53 is connected between the base of a bias supply transistor 41 and the base of a first temperature compensating transistor in order to suppress variations in the power voltage.

In this bias circuit, a signal inputted from an input signal terminal 01 is amplified by a high-frequency power amplifying transistor 31 and outputted to a signal terminal 02 via a matching circuit 12. In the high-output operation, the power amplitude of the base of the high-frequency power amplifying transistor 31 increases and the signal leaks into the base of a bias supply transistor 41 via a resistor 51. As a result, the base potential of the bias supply transistor 41 becomes unstable at high frequencies.

Capacitors 61', 62' and 69 shown in the twenty-fifth embodiment are designed to stabilize, at high frequencies, the base potential of each of the bias supply transistor 41 and a first temperature compensating transistor 42 at high output. The high-frequency-induced voltage drop of the resistor 51 and variations in the bias voltage caused by variations in the base voltage of the bias supply transistor 41 and the first temperature compensating transistor 42 are suppressed by absorbing the variations in a current through charging and discharging of the electric charges of the capacitors 61', 62' and 69.

In particular, the capacitor 69 may share a necessary capacitor between the base of the bias supply transistor 41 and a reference potential and between the base of the first temperature compensating transistor 42 and the reference potential to reduce the chip footprint. Further, it is possible to suppress a drop of the operating point of the high-frequency power amplifying transistor 31 at high output and suppress degradation of linearity due to gain compression.

Twenty-Sixth Embodiment

Figure 27:
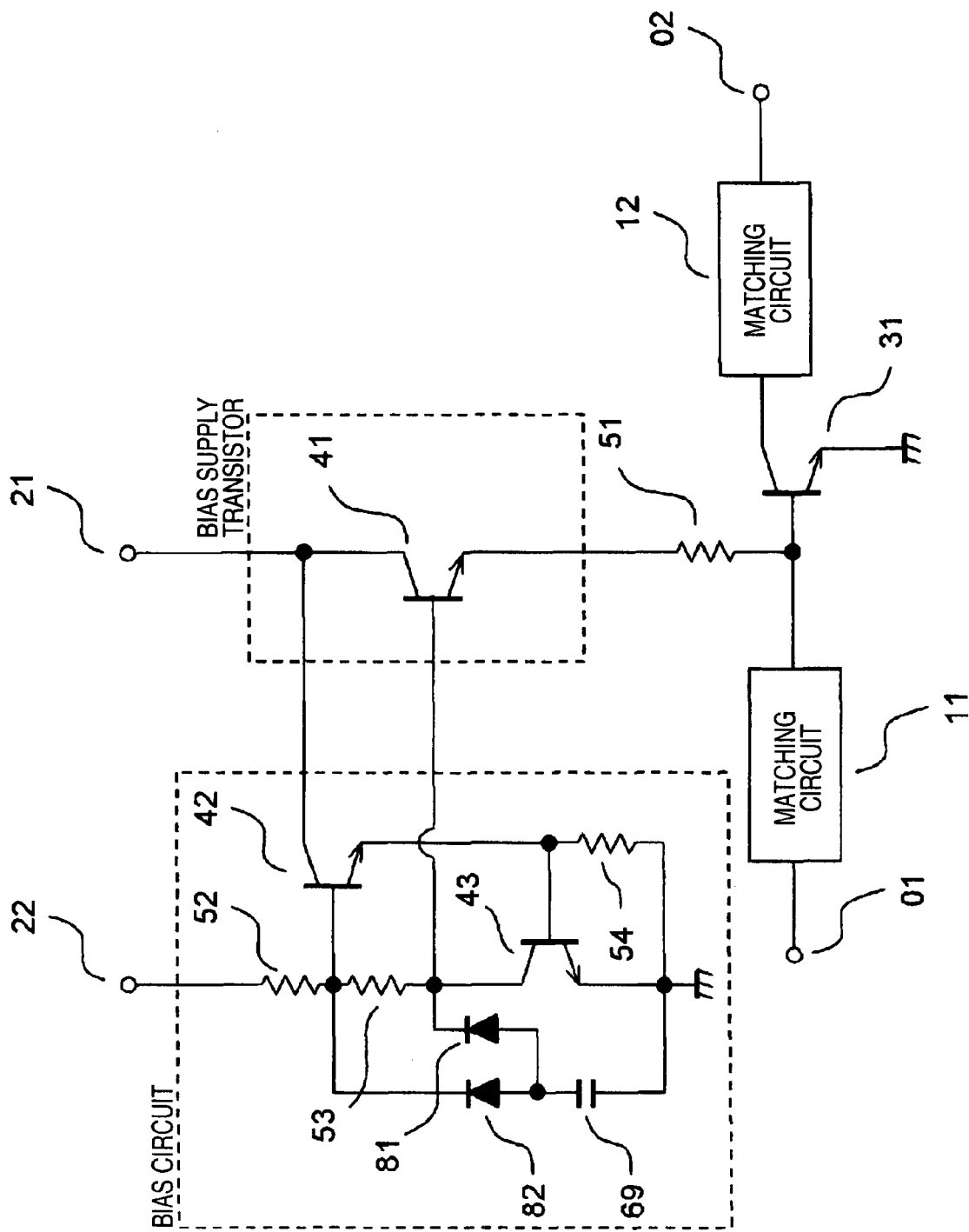
FIG. 27 is a circuit diagram showing the configuration of a high-frequency power amplifier according to the twenty-sixth embodiment of the invention.

FIG. 27 is a circuit diagram of a high-frequency power amplifier according to the twenty-sixth embodiment of the invention. In the high-frequency power amplifier shown in FIG. 27, a resistor 53 is connected between the base of a bias supply transistor 41 and the base of a first temperature compensating transistor in order to suppress variations in the power voltage. In this bias circuit, a signal inputted from an input signal terminal 01 is amplified by a high-frequency power amplifying transistor 31 and outputted to a signal terminal 02 via a matching circuit 12. In the high-output operation, the power amplitude of the base of the high-frequency power amplifying transistor 31 increases and the signal leaks into the base of a bias supply transistor 41 via a resistor 51. As a result, the base potential of the bias supply transistor 41 becomes unstable at high frequencies.

A capacitor 69 and diodes 81 and 82 shown in the twenty-sixth embodiment are designed to stabilize, at high frequencies, the base potential of each of the bias supply transistor 41 and a first temperature compensating transistor 42 at high output. The high-frequency-induced voltage drop of the resistor 51 and variations in the bias voltage caused by variations in the base voltage of the bias supply transistor 41 are suppressed by absorbing the variations in a current through charging and discharging of the electric charges of the capacitor 69 and the diodes 81 and 82.

In particular, the capacitor 69 may share a necessary reactance element between the base of the bias supply transistor 41 and a reference potential and between the base of the first temperature compensating transistor 42 and the reference potential to reduce the chip footprint. Further, it is possible to suppress a drop of the operating point of the high-frequency power amplifying transistor 31 at high output and suppress degradation of linearity due to gain compression.

Twenty-Seventh Embodiment

Figure 28:
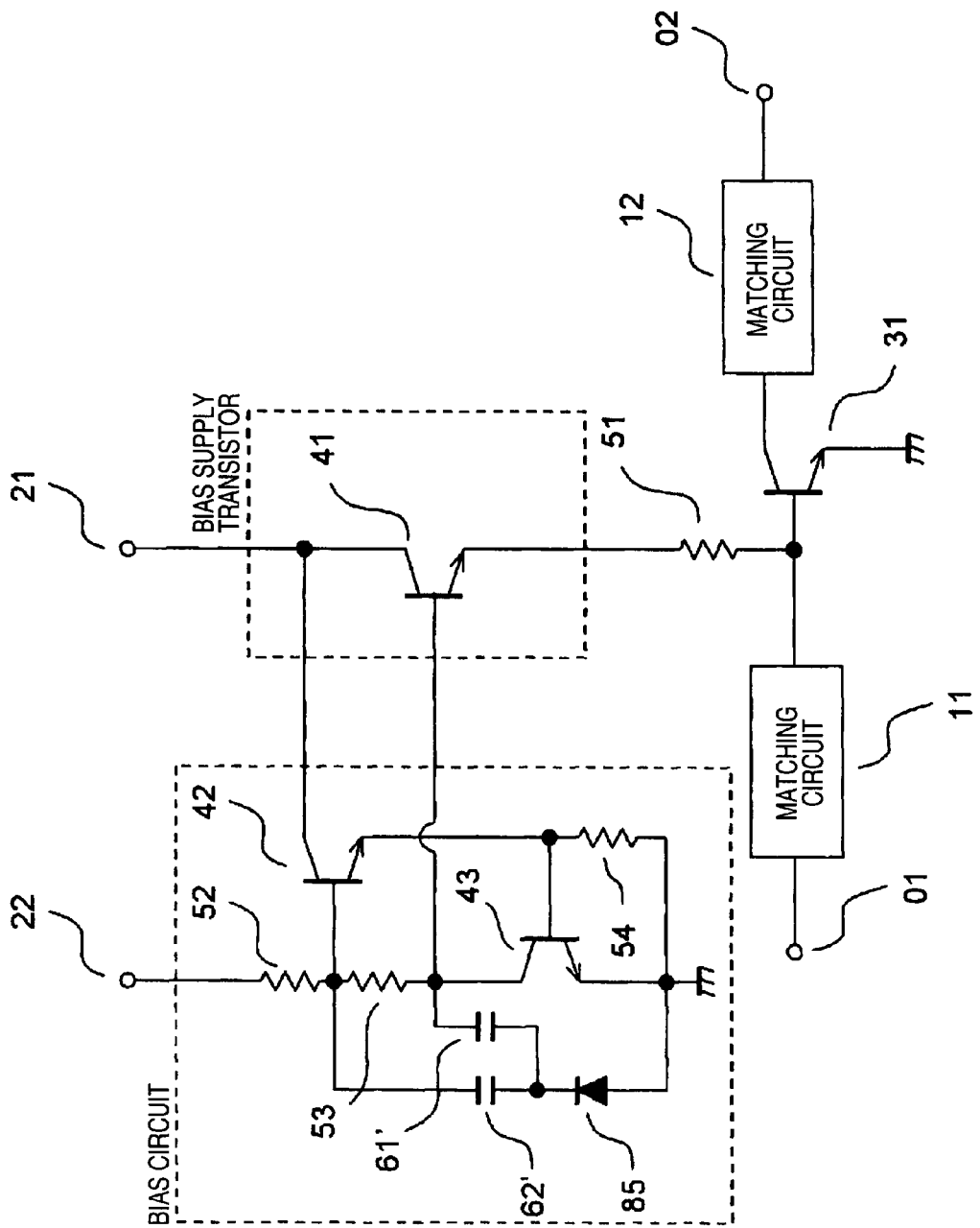
FIG. 28 is a circuit diagram showing the configuration of a high-frequency power amplifier according to the twenty-seventh embodiment of the invention.

FIG. 28 is a circuit diagram of a high-frequency power amplifier according to the twenty-seventh embodiment of the invention. In the high-frequency power amplifier shown in FIG. 28, a resistor 53 is connected between the base of a bias supply transistor 41 and the base of a first temperature compensating transistor in order to suppress variations in the power voltage.

In this bias circuit, a signal inputted from an input signal terminal 01 is amplified by a high-frequency power amplifying transistor 31 and outputted to a signal terminal 02 via a matching circuit 12. In the high-output operation, the power amplitude of the base of the high-frequency power amplifying transistor 31 increases and the signal leaks into the base of a bias supply transistor 41 via a resistor 51. As a result, the base potential of the bias supply transistor 41 becomes unstable at high frequencies.

Capacitors 61' and 62' and a diode 85 shown in the twenty-seventh embodiment are designed to stabilize, at high frequencies, the base potential of each of the bias supply transistor 41 and a first temperature compensating transistor 42 at high output. The high-frequency-induced voltage drop of the resistor 51 and variations in the bias voltage caused by variations in the base voltage of the bias supply transistor 41 are suppressed by absorbing the variations in a current through charging and discharging of the electric charges of the capacitors 61' and 62' and the diode 85.

In particular, the diode 85 may share a necessary reactance element between the base of the bias supply transistor 41 and a reference potential and between the base of the first temperature compensating transistor 42 and the reference potential to reduce the chip footprint. Further, it is possible to suppress a drop of the operating point of the high-frequency power amplifying transistor 31 at high output and suppress degradation of linearity due to gain compression.

Twenty-Eighth Embodiment

Figure 29:
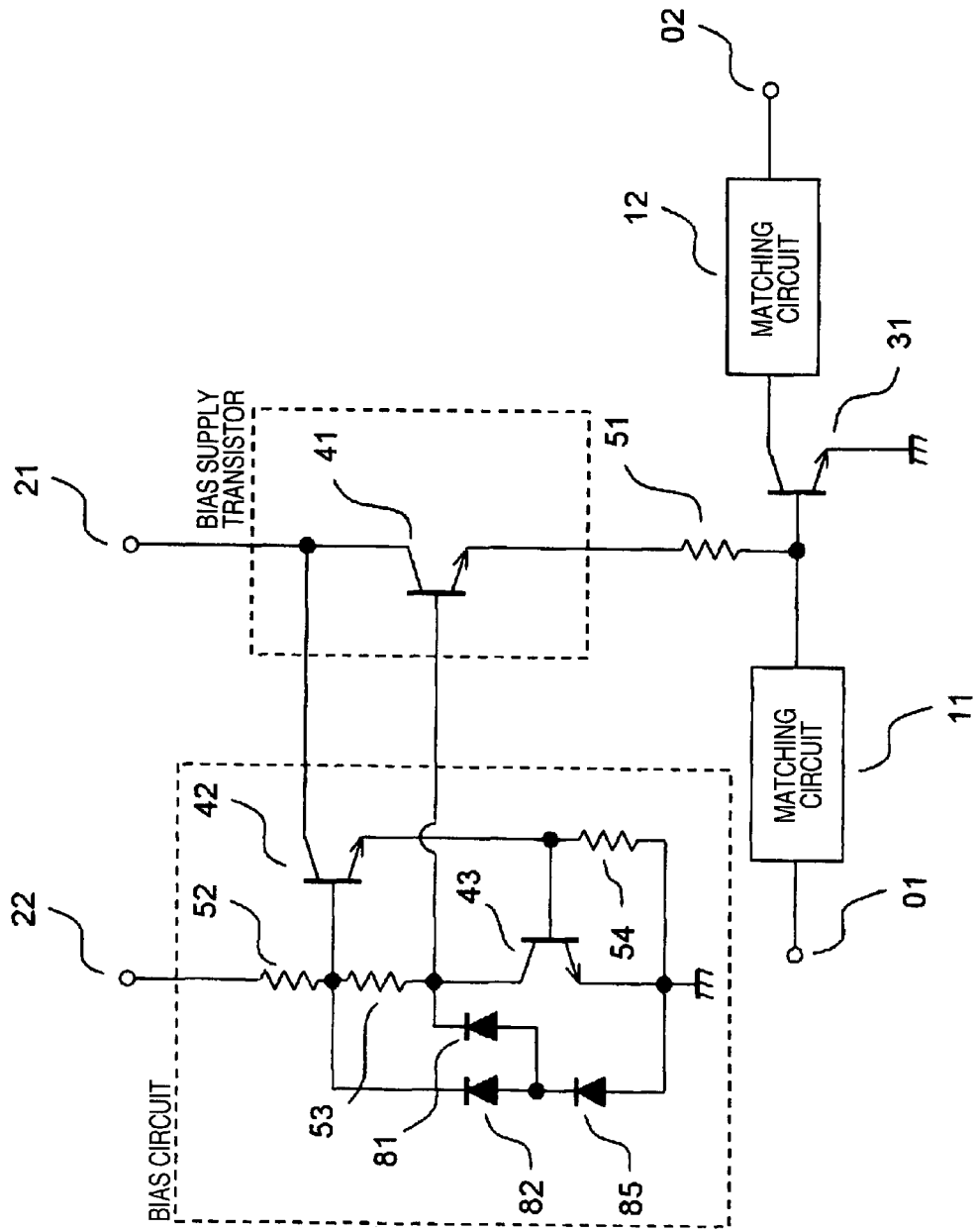
FIG. 29 is a circuit diagram showing the configuration of a high-frequency power amplifier according to the twenty-eighth embodiment of the invention.

FIG. 29 is a circuit diagram of a high-frequency power amplifier according to the twenty-eighth embodiment of the invention. In the high-frequency power amplifier shown in FIG. 29, a resistor 53 is connected between the base of a bias supply transistor 41 and the base of a first temperature compensating transistor in order to suppress variations in the power voltage.

In this bias circuit, a signal inputted from an input signal terminal 01 is amplified by a high-frequency power amplifying transistor 31 and outputted to a signal terminal 02 via a matching circuit 12. In the high-output operation, the power amplitude of the base of the high-frequency power amplifying transistor 31 increases and the signal leaks into the base of a bias supply transistor 41 via a resistor 51. As a result, the base potential of the bias supply transistor 41 becomes unstable at high frequencies.

Diodes 81, 82 and 85 shown in the twenty-eighth embodiment are designed to stabilize, at high frequencies, the base potential of each of the bias supply transistor 41 and a first temperature compensating transistor 42 at high output. The high-frequency-induced voltage drop of the resistor 51 and variations in the bias voltage caused by variations in the base voltage of the bias supply transistor 41 are suppressed by absorbing the variations in a current through charging and discharging of the electric charges of the diodes 81, 82 and 85.

In particular, the diode 85 may share a necessary reactance element between the base of the bias supply transistor 41 and a reference potential and between the base of the first temperature compensating transistor 42 and the reference potential to reduce the chip footprint. Further, it is possible to suppress a drop of the operating point of the high-frequency power amplifying transistor 31 at high output and suppress degradation of linearity due to gain compression.

Twenty-Ninth Embodiment

Figure 30:
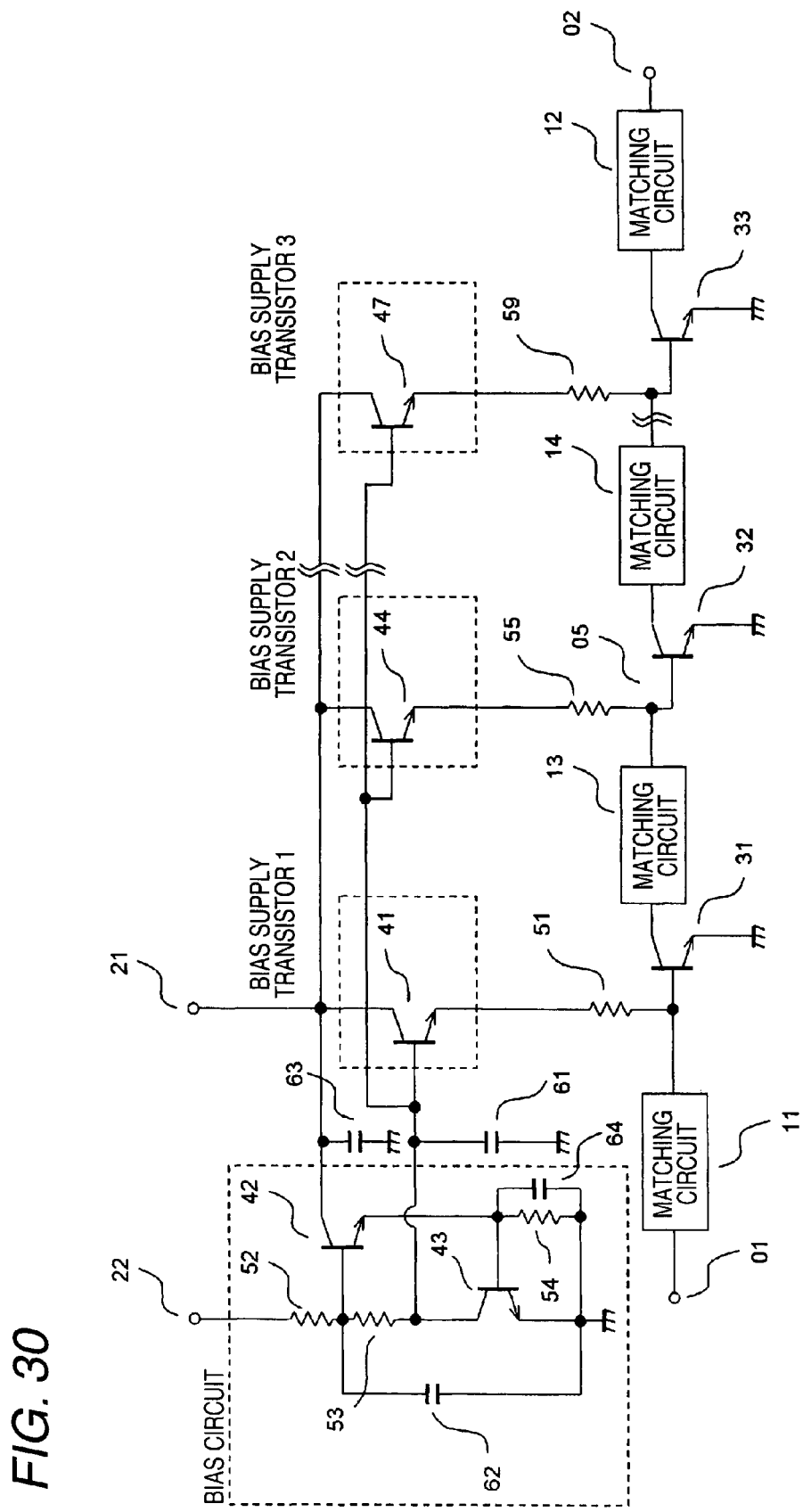
FIG. 30 is a circuit diagram showing the configuration of a high-frequency power amplifier according to the twenty-ninth embodiment of the invention.

FIG. 30 is a circuit diagram of a high-frequency power amplifier according to the twenty-ninth embodiment of the invention. The high-frequency power amplifier shown in FIG. 30 is composed of three stages. A bias circuit uses the first temperature compensating transistor 42 and the second temperature compensating transistor 43 in common and includes bias supply transistors 41, 44, 47 in respective stages. A resistor 53 is connected between the base of the bias supply transistors 41, 44, 47 and the base of the first temperature compensating transistor 42 in order to suppress variations in the power voltage.

In this bias circuit, a signal inputted from an input signal terminal 01 is amplified by a high-frequency power amplifying transistor 31 in the first stage and the signal is inputted to a high-frequency power amplifier 32 in the intermediate stage via a matching circuit 13. The signal is inputted to a high-frequency power amplifying transistor 33 in the last stage. The signal amplified by the high-frequency power amplifying transistor 33 in the last stage is outputted to a signal terminal 02 via a matching circuit 12.

In the high-output operation, in particular the power amplitude of the high-frequency power amplifying transistor 33 in the last stage increases and the signal leaks into the base of a bias supply transistor 47. The base potential of the bias supply transistor 47 thus becomes unstable at high frequencies.

Similarly, in the first and intermediate stages, the power amplitude of the base of each of the high-frequency amplifying transistors 31 and 32 in the first stage increases and the signal leaks into the base of each of the bias supply transistors 41 and 44 via resistors 51 and 55. The base potential of the bias supply transistors 41 and 44 thus becomes unstable at high frequencies.

Capacitors 61 and 62 shown in the twenty-ninth embodiment are designed to stabilize, at high frequencies, the base potential of each of the bias supply transistors 41, 44 and 47 at high output. A capacitor 63 is designed to stabilize, at high frequencies, the collector potential of the first temperature compensating transistor 42 and the collector potential of each of the bias supply transistors 41, 44 and 47. Further, a capacitor 64 is designed to stabilize, at high frequencies, the base potential of the second temperature compensating transistor 43.

The high-frequency-induced voltage drop of the resistors 51, 55 and 59 and variations in the bias voltage caused by variations in the base voltage of the bias supply transistors 41, 44 and 47 are suppressed by absorbing the variations in a current through charging and discharging of the electric charges of the capacitors 61, 62, 63 and 64. It is thus possible to suppress a drop of the operating point of each of the high-frequency transistors 31, 32 and 33 at high output and suppress degradation of linearity due to gain compression.

While the bias circuits according to the fifth and sixth embodiments are described as examples in this embodiment, any one of the bias circuits shown in the first to twenty-eighth embodiments may be applied. While a high-frequency amplifier including three stages is described as an example in this embodiment, a high-frequency power amplifier including two stages or four stages may be used instead. By using any one of the bias circuits shown in the first to twenty-eighth embodiments in a multi-stage high-frequency power amplifier, the linearity at high output is improved.

Thirtieth Embodiment

Figure 31:
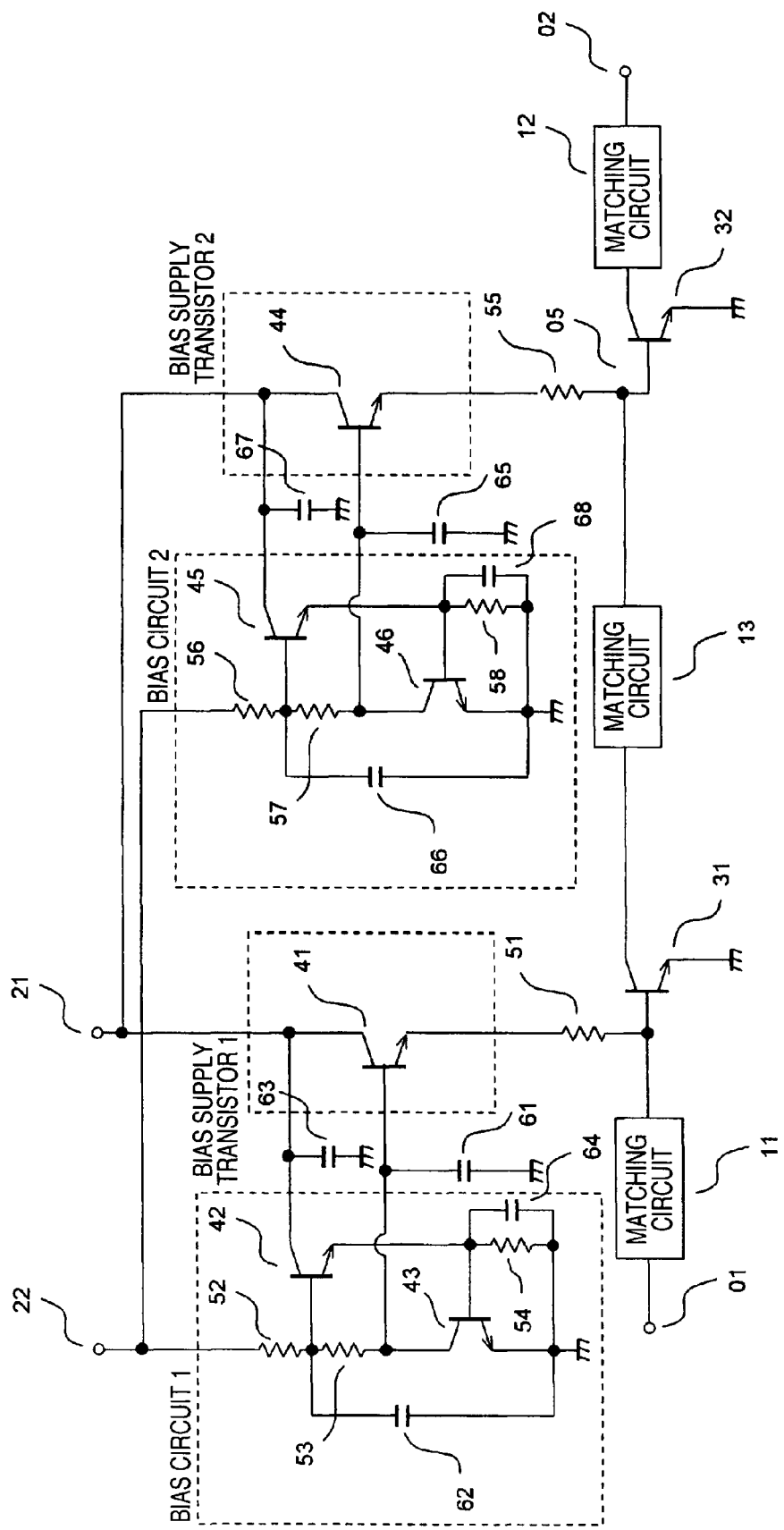
FIG. 31 is a circuit diagram showing the configuration of a high-frequency power amplifier according to the thirtieth embodiment of the invention.

FIG. 31 is a circuit diagram of a high-frequency power amplifier according to the thirtieth embodiment of the invention. The high-frequency power amplifier shown in FIG. 31 is composed of two stages. A bias circuit includes the first temperature compensating transistors 42, 45 and the second temperature compensating transistors 43, 46 in each stage. Resistors 53 and 57 are connected between the base of the bias supply transistors 41 and 44 and the base of the first temperature compensating transistors 42 and 45 in order to suppress variations in the power voltage.

In this bias circuit, a signal inputted from an input signal terminal 01 is amplified by a high-frequency power amplifying transistor 31 in the first stage and the signal is inputted to a high-frequency power amplifier 32 in the last stage via a matching circuit 13. The signal amplified by the high-frequency power amplifying transistor 32 in the last stage is outputted to a signal terminal 02 via a matching circuit 12.

In the high-output operation, in particular the power amplitude of the high-frequency power amplifying transistor 32 in the last stage increases and the signal leaks into the base of a bias supply transistor 44. The base potential of the bias supply transistor 44 thus becomes unstable at high frequencies.

Capacitors 61, 62, 65, 66 shown in the thirtieth embodiment are designed to stabilize, at high frequencies, the base potential of each of the bias supply transistors 41 and 44 at high output. Capacitors 63 and 67 are designed to stabilize, at high frequencies, the collector potential of each of the first temperature compensating transistors 42 and 45 and the collector potential of each of the bias supply transistors 41 and 44. Further, capacitors 64 and 68 are designed to stabilize, at high frequencies, the base potential of each of the second temperature compensating transistors 43 and 46.

The high-frequency-induced voltage drop of the resistors 51 and 55 and variations in the bias voltage caused by variations in the base voltage of the bias supply transistors 41 and 44 are suppressed by absorbing the variations in a current through charging and discharging of the electric charges of the capacitors 61, 62, 63, 64, 65, 66, 67 and 68. It is thus possible to suppress a drop of the operating point of each of the high-frequency transistors 31 and 32 at high output and suppress degradation of linearity due to gain compression.

While the bias circuits according to the fifth and sixth embodiments are described as examples in this embodiment, any one of the bias circuits shown in the first to twenty-eighth embodiments may be applied. While a high-frequency amplifier including two stages is described as an example in this embodiment, a high-frequency power amplifier including three or more stages may be used instead. By using any one of the bias circuits shown in the first to twenty-eighth embodiments in a multi-stage high-frequency power amplifier, the linearity at high output is improved.

Thirty-First Embodiment

Figure 32:
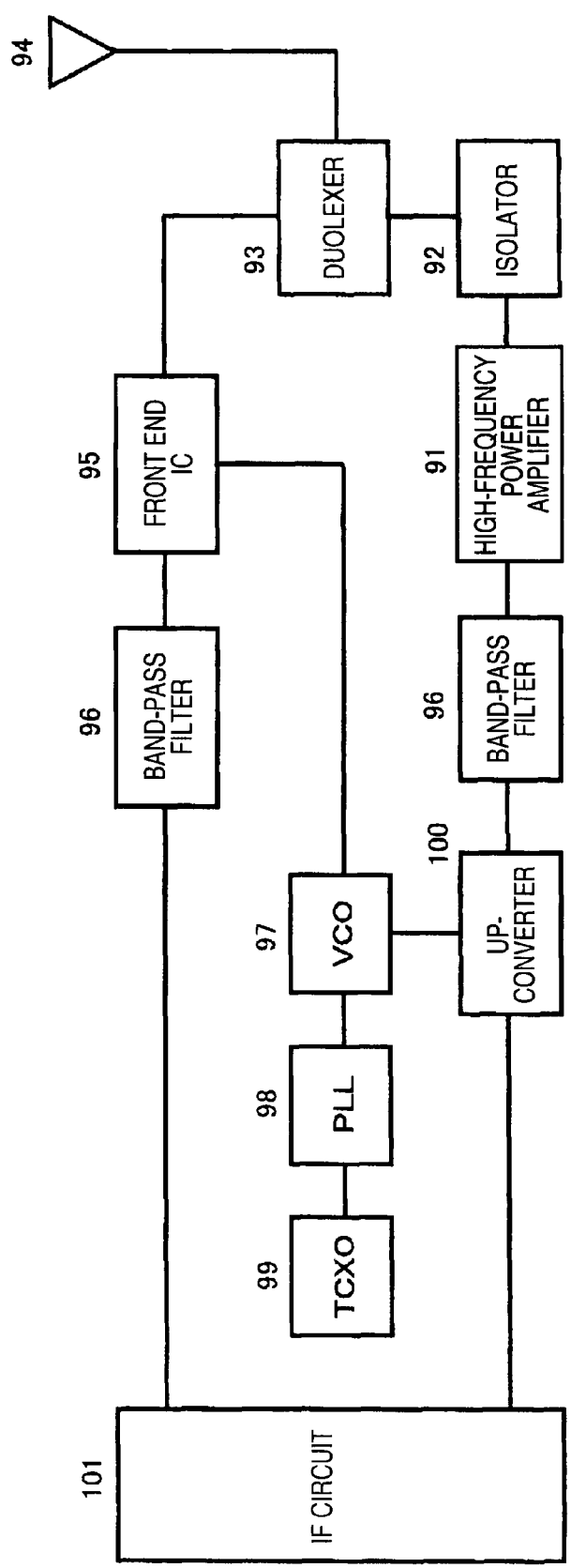
FIG. 32 is a block diagram of a communication device according to the thirty-first embodiment of the invention.
Figure 33:
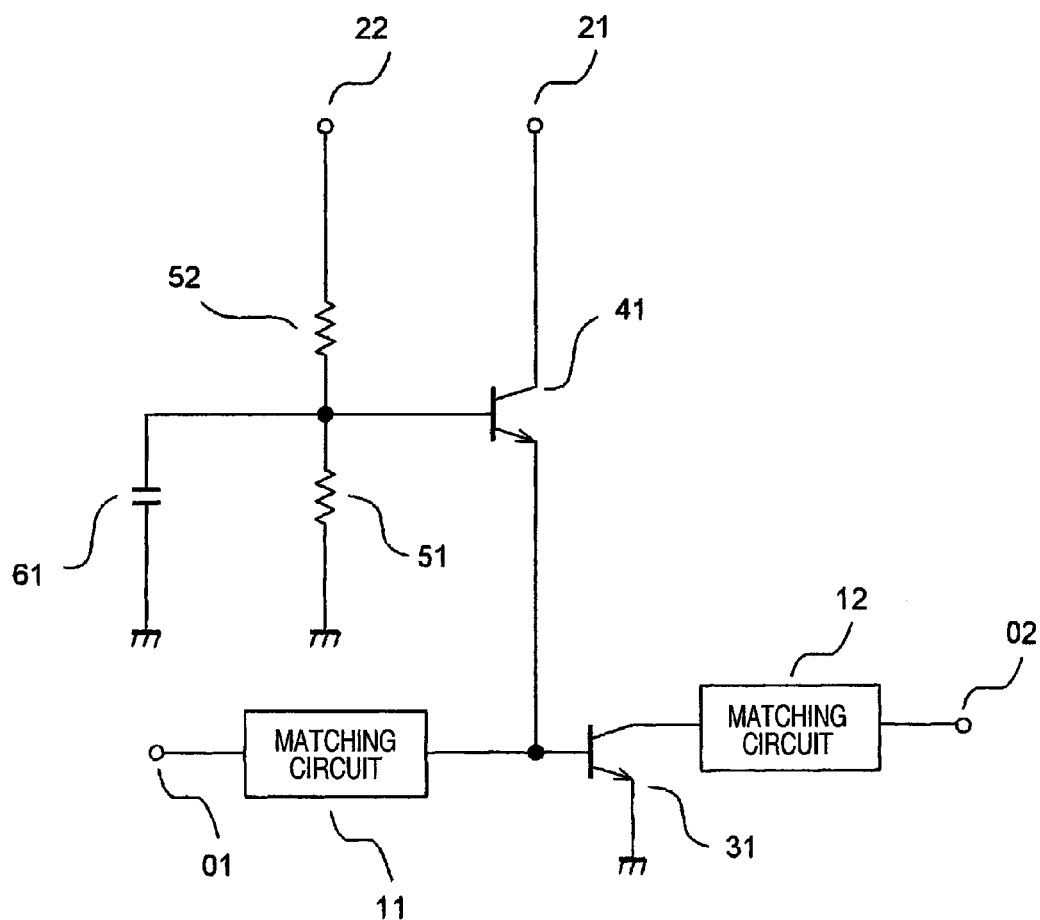
FIG. 33 is a circuit diagram showing the configuration of a related art high-frequency power amplifier.
Figure 34:
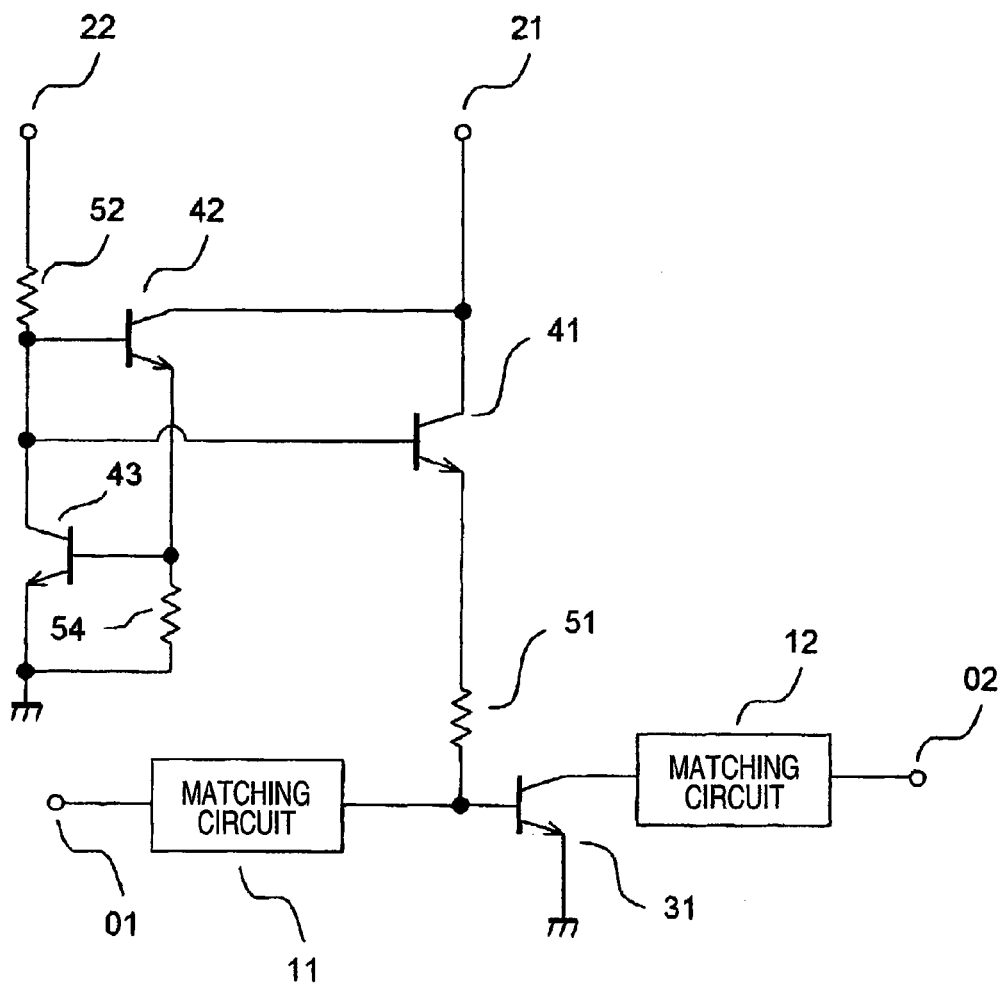
FIG. 34 is another circuit diagram showing the configuration of a related art high-frequency power amplifier.
Figure 35:
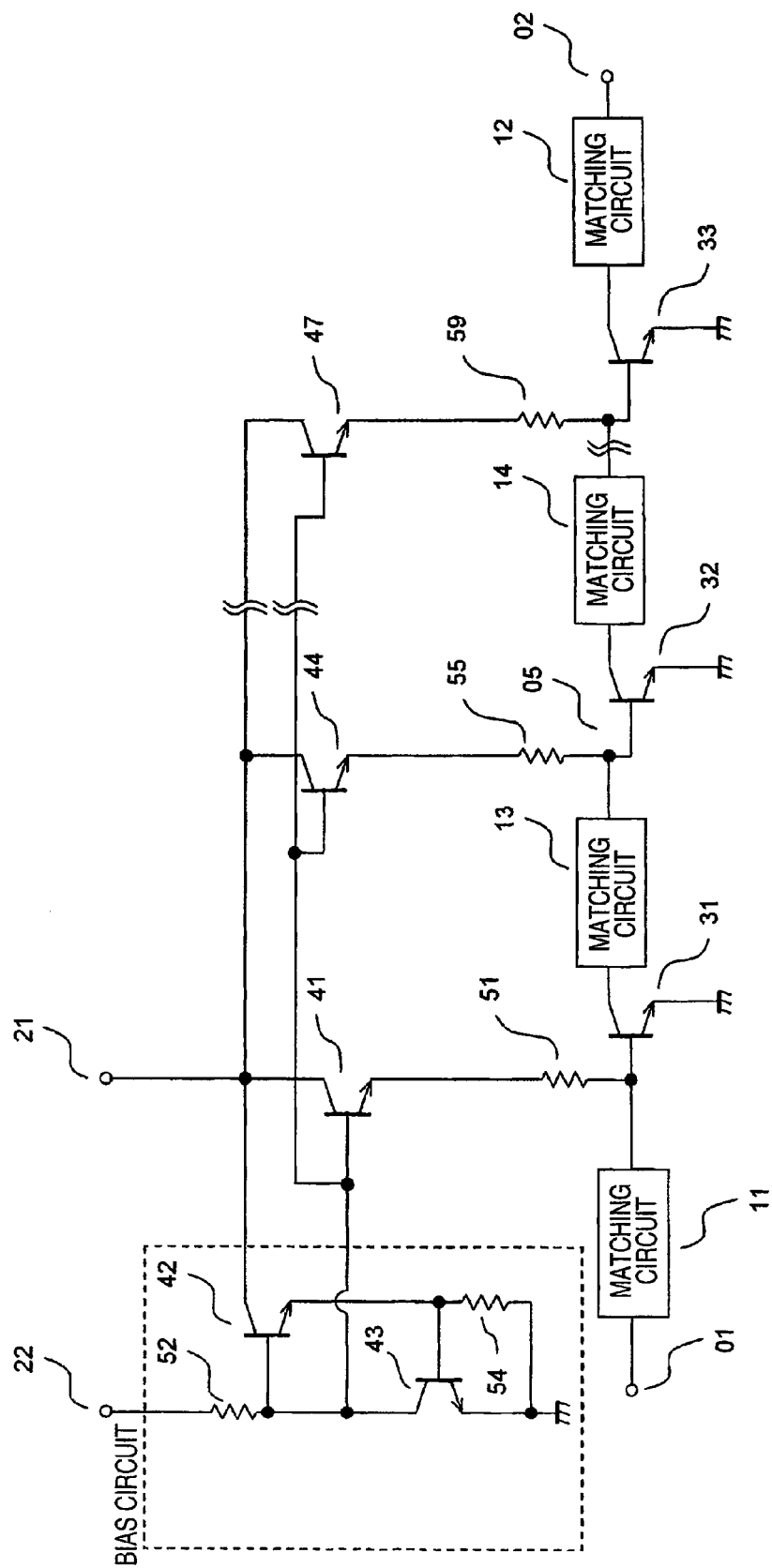
FIG. 35 is another circuit diagram showing the configuration of a related art high-frequency power amplifier.

FIG. 32 is a circuit diagram of a high-frequency power amplifier according to the thirty-first embodiment of the invention. The high-frequency power amplifier 91 is a two-stage high-frequency power amplifier using for example the high-frequency power amplifying transistor 31 and the high-frequency power amplifying transistor 32 according to the thirtieth embodiment.

In FIG. 32, a numeral 91 represents a high-frequency power amplifier, 92 an isolator connected to the output of the high-frequency power amplifier 91, 93 a duplexer connected to the isolator 92, an antenna 94 and a front end IC 95. A numeral 95 represents a band-pass filter installed in a transmitter and a receiver, 97 a VCO, 98 a PLL, 98 a TCXO, 100 an up-converter, and 101 an IF circuit for processing an intermediate frequency signal.

With the effect described in the thirtieth embodiment, it is possible to suppress a drop of the operating point of each of the high-frequency amplifying transistors 31 and 32 and suppress degradation of linearity due to gain compression. This improves the linearity of the high-frequency power amplifier 91 shown in FIG. 32 thus enhancing the performance of the communication device.

With a high-frequency power amplifier and a high-frequency power amplifier device according to the embodiments of the invention, it is possible to stabilize, at high frequencies, the bias voltage of a bias circuit featuring the temperature compensating effect of the high-frequency power amplifying transistor 31 and in particular to substantially improve the linearity of the high-frequency power amplifier and the high-frequency power amplifier device at high output.

The invention compensates for the high-frequency-induced variations in capacitance of a high-frequency amplifying transistor and stabilizes, at high frequencies, the bias voltage of a bias circuit featuring the temperature compensating effect, thereby improving the linearity of a high-frequency power amplifier. The invention is useful as a high-frequency power amplifier employed in a W-LAN terminal or a mobile portable terminal.

What is claimed is:

1. A high-frequency power amplifier, comprising:
a bias supply transistor for supplying a bias to the base of a high-frequency amplifying transistor;
a bias circuit for supplying a temperature-compensated bias current to the base of said bias supply transistor; and
a first stabilizing element for stabilizing the base potential of said bias supply transistor at high frequencies
wherein said bias circuit includes:
a first temperature compensating transistor the collector of which is connected to the collector of said bias supply transistor, the emitter of which is grounded via a first resistor, and the base of which is connected to the base of said bias supply transistor via a second resistor; and
a second temperature compensating transistor the collector of which is connected to the base of said bias supply transistor, the base of which is connected to the emitter of said first temperature compensating transistor, and the emitter of which is grounded; and
wherein said first stabilizing element is connected between the base of said bias supply transistor and a ground,
said high-frequency power amplifier further comprising a second stabilizing element connected to the base of said first temperature compensating transistor and said ground.

2. The high-frequency power amplifier according to claim 1, further comprising:
a third stabilizing element connected to the collector of said bias supply transistor and a ground.

3. The high-frequency power amplifier according to claim 1, further comprising:
a third stabilizing element connected to the base of said second temperature compensating transistor and a ground.

4. A high-frequency power amplifier, comprising:
a bias supply transistor for supplying a bias to the base of a high-frequency amplifying transistor;
a bias circuit for supplying a temperature-compensated bias current to the base of said bias supply transistor; and
a first stabilizing element for stabilizing the base potential of said bias supply transistor at high frequencies,
wherein said bias circuit includes:
a first temperature compensating transistor the collector of which is connected to the collector of said bias supply transistor, the emitter of which is grounded via a first resistor, and the base of which is connected to the base of said bias supply transistor via a second resistor; and
a second temperature compensating transistor the collector of which is connected to the base of said bias supply transistor, the base of which is connected to the emitter of said first temperature compensating transistor, and the emitter of which is grounded;
wherein said first stabilizing element includes:
a first capacitor one end of which is connected to the base of said first temperature compensating transistor;
a second capacitor one end of which is connected to the collector of said second temperature compensating transistor; and
a third capacitor one end of which is grounded; and
wherein the other ends of said first, second and third capacitors are connected to each other.

5. A high-frequency power amplifier, comprising:
a bias supply transistor for supplying a bias to the base of a high-frequency amplifying transistor;
a bias circuit for supplying a temperature-compensated bias current to the base of said bias supply transistor; and
a first stabilizing element for stabilizing the base potential of said bias supply transistor at high frequencies,
wherein said bias circuit includes:
a first temperature compensating transistor the collector of which is connected to the collector of said bias supply transistor, the emitter of which is grounded via a first resistor, and the base of which is connected to the base of said bias supply transistor via a second resistor; and
a second temperature compensating transistor the collector of which is connected to the base of said bias supply transistor, the base of which is connected to the emitter of said first temperature compensating transistor, and the emitter of which is grounded;
wherein said first stabilizing element includes:
a first diode the cathode of which is connected to the base of said first temperature compensating transistor;
a second diode the cathode of which is connected to the collector of said second temperature compensating transistor; and
a capacitor one end of which is grounded; and
wherein the cathodes of said first and second diodes and the other end of said capacitor are connected to each other.

6. A high-frequency power amplifier, comprising:
a bias supply transistor for supplying a bias to the base of a high-frequency amplifying transistor;
a bias circuit for supplying a temperature-compensated bias current to the base of said bias supply transistor; and
a first stabilizing element for stabilizing the base potential of said bias supply transistor at high frequencies,
wherein said bias circuit includes:
a first temperature compensating transistor the collector of which is connected to the collector of said bias supply transistor, the emitter of which is grounded via a first resistor, and the base of which is connected to the base of said bias supply transistor via a second resistor; and
a second temperature compensating transistor the collector of which is connected to the base of said bias supply transistor, the base of which is connected to the emitter of said first temperature compensating transistor, and the emitter of which is grounded;
said first stabilizing element includes: a first capacitor one end of which is connected to the base of said first temperature compensating transistor;
a second capacitor one end of which is connected to the collector of said second temperature compensating transistor; and
a diode the anode of which is grounded; and
wherein the other ends of said first and second capacitors and the cathode of said diode are connected to each other.

7. A high-frequency power amplifier, comprising:
a bias supply transistor for supplying a bias to the base of a high-frequency amplifying transistor;
a bias circuit for supplying a temperature-compensated bias current to the base of said bias supply transistor; and
a first stabilizing element for stabilizing the base potential of said bias supply transistor at high frequencies,
wherein said bias circuit includes:
a first temperature compensating transistor the collector of which is connected to the collector of said bias supply transistor, the emitter of which is grounded via a first resistor, and the base of which is connected to the base of said bias supply transistor via a second resistor; and
a second temperature compensating transistor the collector of which is connected to the base of said bias supply transistor, the base of which is connected to the emitter of said first temperature compensating transistor, and the emitter of which is grounded;
wherein said first stabilizing element includes:
a first diode the cathode of which is connected to the base of said first temperature compensating transistor;
a second diode the cathode of which is connected to the collector of said second temperature compensating transistor; and
a third diode the anode of which is grounded; and
wherein the anodes of said first and second diodes and the cathode of said third diode are connected to each other.

* * * * *